(12) United States Patent
Shimizu

(10) Patent No.: US 9,998,132 B2
(45) Date of Patent: Jun. 12, 2018

(54) SEMICONDUCTOR DEVICE

(71) Applicant: Renesas Electronics Corporation, Tokyo (JP)

(72) Inventor: Takehiro Shimizu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/435,001

(22) Filed: Feb. 16, 2017

(65) Prior Publication Data

US 2017/0187386 A1   Jun. 29, 2017

Related U.S. Application Data

(63) Continuation of application No. 15/078,944, filed on Mar. 23, 2016, now Pat. No. 9,608,654.

(30) Foreign Application Priority Data

May 1, 2015   (JP) .................................. 2015-093963

(51) Int. Cl.
  *H03M 1/46*   (2006.01)
  *H03M 1/38*   (2006.01)
  *H03M 1/08*   (2006.01)

(52) U.S. Cl.
  CPC ............... *H03M 1/08* (2013.01); *H03M 1/38* (2013.01)

(58) Field of Classification Search
  None
  See application file for complete search history.

(56) References Cited

U.S. PATENT DOCUMENTS 7,049,993 B2   5/2006   Ando
7,973,693 B2   7/2011   Louwsma
8,482,446 B2   7/2013   Haneda
9,602,123 B2 *   3/2017   Sundblad ................ H03M 1/38

FOREIGN PATENT DOCUMENTS

JP   2012-104938 A   5/2012

* cited by examiner

*Primary Examiner* — Howard Williams
(74) *Attorney, Agent, or Firm* — McGinn IP Law Group, PLLC

(57) ABSTRACT

A semiconductor device having an analog/digital conversion circuit converting an analog signal to a digital signal, includes a holding circuit outputting an analog signal having a value according to a value of an analog signal supplied in a first period; and a prediction circuit generating a first digital signal based on bit position information from a prediction table corresponding to the supplied analog signal.

16 Claims, 11 Drawing Sheets

FIG. 2A

| TIME | T/4 | T/2 | 3T/4 | T |
|---|---|---|---|---|
| REFERENCE VOLTAGE INFORMTAION | Vref/4 | Vref/2 | 5Vref/8 | 3Vref/4 |
| BIT POSITION INFORMATION | b3 | b2 | b1 | b0 |

FIG. 2B

| TIME | T/4 | T/2 | 3T/4 | T |
|---|---|---|---|---|
| REFERENCE VOLTAGE INFORMTAION | Vref/4 | Vref/2 | 3Vref/4 | Vref |
| BIT POSITION INFORMATION | b3 | b2 | b1 | b0 |

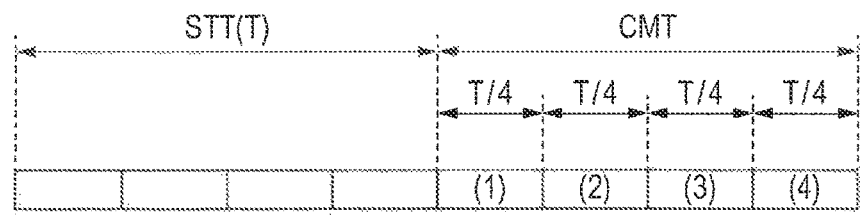
FIG. 3A
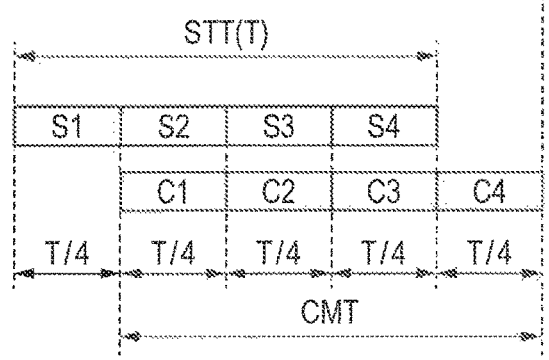
FIG. 3B
FIG. 4
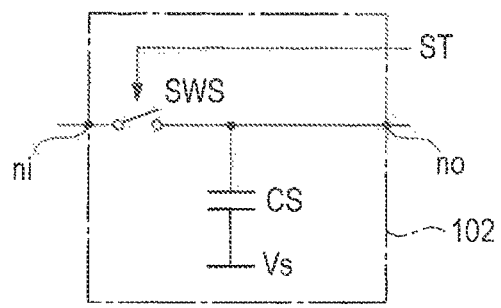

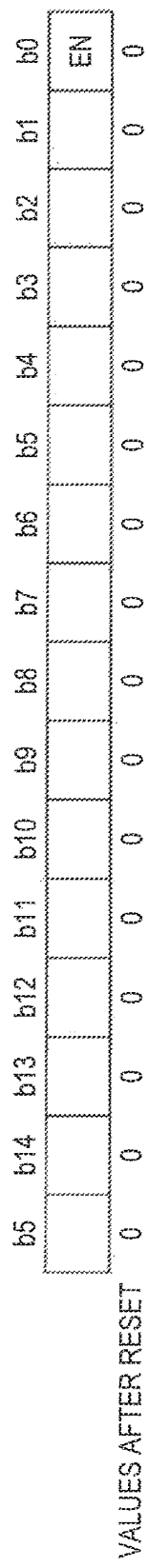

FIG. 11A

| 1cycle | 2cycle | 3cycle | 4cycle |
|---|---|---|---|
| 1 | 1 | 1 | 1 |
| | | | 0 |
| | | 0 | 1 |
| | | | 0 |
| | 0 | 1 | 1 |
| | | | 0 |
| | | 0 | 1 |
| | | | 0 |
| 0 | 1 | 1 | 1 |
| | | | 0 |
| | | 0 | 1 |
| | | | 0 |
| | 0 | 1 | 1 |
| | | | 0 |
| | | 0 | 1 |
| | | | 0 |

FIG. 11B 1111 (15/16 TO 1)
1110 (7/8 TO 15/16)
1101 (13/16 TO 7/8)
1100 (3/4 TO 13/16)
1011 (11/16 TO 3/4)
1010 (5/8 TO 11/16)
1001 (9/16 TO 5/8)
⌐ ‾ ‾ ‾ ‾ ‾ ‾ ‾ ‾ ‾ ‾ ‾ ‾ ‾ ‾ ‾ ¬
¦ 1000 (1/2 TO 9/16) ¦
└ ─ ─ ─ ─ ─ ─ ─ ─ ─ ─ ─ ─ ─ ─ ─ ┘
0111 (7/16 TO 1/2)
0110 (3/8 TO 7/16)
0101 (5/16 TO 3/8)
┌─────────────────┐
│ 0100 (1/4 TO 5/16) │
└─────────────────┘
0011 (3/16 TO 1/4)
0010 (1/8 TO 3/16)
0001 (1/16 TO 1/8)
0000 (0 TO 1/16)

CORRECT
VALUE

SEMICONDUCTOR DEVICE

This Application is a Continuation Application of U.S. patent application Ser. No. 15/078,944, which was filed on Mar. 23, 2016, and the disclosure of which is incorporated herein in its entirety by reference thereto.

CROSS-REFERENCE TO RELATED APPLICATIONS

The disclosure of Japanese Patent Application No. 2015-093963 filed on May 1, 2015 including the specification, drawings and abstract is incorporated herein by reference in its entirety.

BACKGROUND

The present invention relates to a semiconductor device and, more particularly, to a semiconductor device having therein an analog/digital conversion (hereinbelow, A/D conversion) circuit.

An example of a semiconductor device having therein an A/D conversion circuit is a microcomputer (hereinbelow, also called CPU). In recent years, the speed of a CPU is increasing. The number of functions provided for a CPU is also increasing and a CPU has multiple functions.

On the other hand, it is undesirable to increase external terminals (pins) of a semiconductor device as a CPU from the viewpoint of reduction in size and weight and/or lower price of an electronic device having the CPU. For reduction in the number of pins of a semiconductor device, it is becoming difficult to assure, in the semiconductor device, a dedicated input pin for supplying an analog signal to an A/D conversion circuit from the outside of the semiconductor device. Consequently, for example, a pin used for another function and an input pin of the A/D conversion circuit are made common. In this case, for example, a selector for switching is coupled between the common pin and the A/D conversion circuit.

Patent Literature 1 discloses an A/D conversion circuit capable of suppressing decrease in a dynamic range while improving the A/D conversion characteristic.

RELATED ART LITERATURE

Patent Literature

Patent Literature 1
Japanese Unexamined Patent Application Publication No. 2012-104938

SUMMARY

When a pin is commonly used by another function and an A/D conversion circuit, noise is transmitted to the A/D conversion circuit via a selector or the like. Particularly, in the case of increasing the speed of a CPU including the A/D conversion circuit, transmission of noise occurs conspicuously. That is, when the speed is increased, noise resistance of the A/D conversion circuit decreases. In other words, higher speed and noise reduction have a contradictory relation.

The inventors of the present invention provide a semiconductor device having a high-speed A/D conversion circuit realizing improvement in noise resistance.

The patent literature 1 intends to suppress decrease in the dynamic range while improving the A/D conversion characteristic by correcting an analog signal supplied to the A/D conversion circuit. However, the patent literature is not aware of increase in speed of the A/D conversion circuit. Obviously, it is not aware of increase in speed while improving the noise resistance.

The other objects and novel features will become apparent from the description of the specification and the appended drawings.

In an embodiment, a semiconductor device having an A/D conversion circuit has: a holding circuit outputting an analog signal having a value according to a value of an analog signal supplied in a first period; and a prediction table corresponding to the analog signal supplied. The prediction table has reference value information designating a reference value to be compared with the analog signal output from the holding circuit at a plurality of timings in the first period, and bit position information designating a bit position of a digital signal determined by comparison with the reference value.

The semiconductor device has a prediction table corresponding to an analog signal whose value changes. In the prediction table, reference value information at a plurality of timings and bit position information is stored. The prediction table corresponds to an analog signal. Consequently, the prediction table has, as the reference value information, information designating a reference value to be compared with an analog signal at the time of converting the value of the analog signal at a predetermined timing in the first period to a digital signal in a predetermined bit position.

At each of the timings in the first period, the reference value based on the reference value information is compared with the analog signal, and the digital signal in the bit position designated by the bit position information is determined. In such a manner, the digital signal corresponding to the analog signal is obtained every bit position at each of the timings in the first period. Consequently, the speed of the A/D conversion circuit can be made higher as compared with conversion of the analog signal to the digital signal after the first period.

At the time of converting an analog signal to a digital signal by using a prediction table corresponding to the analog signal, it can be regarded that the digital signal is predicted by using the prediction table. At the time of prediction, the digital signal is predicted from a high-weight (for example, most significant) bit position toward a low-weight (for example, least significant) bit position. By the operation, for example, even when the analog signal changes due to noise at the end of the first period, the digital signal in the high-weight bit position is already obtained (already predicted). Consequently, even the analog signal changes due to noise, the digital signal close to the analog signal which is not changed by noise can be obtained.

As a result, by using the prediction table corresponding to the analog signal, the speed of the A/D conversion circuit can be increased. In addition, resistance to noise can be improved.

According to one embodiment of the invention, there is provided a semiconductor device having a high-speed A/D conversion circuit realizing improvement in noise resistance.

BRIEF DESCRIPTION OF THE DRAWINGS

FIGS. 2A and 2B are diagrams illustrating the configuration of a prediction table according to the first embodiment.

FIGS. 3A and 3B are timing charts illustrating the operations of the A/D conversion circuit according to the first embodiment.

FIG. 4 is a circuit diagram illustrating the configuration of a sample and hold circuit according to the first embodiment.

FIGS. 8A and 8B are explanatory diagrams illustrating the configuration of a control register in the semiconductor device according to the first embodiment.

FIGS. 11A and 11B are explanatory diagrams for explaining operation of an A/D conversion circuit according to a second embodiment.

DETAILED DESCRIPTION

Figure 1:
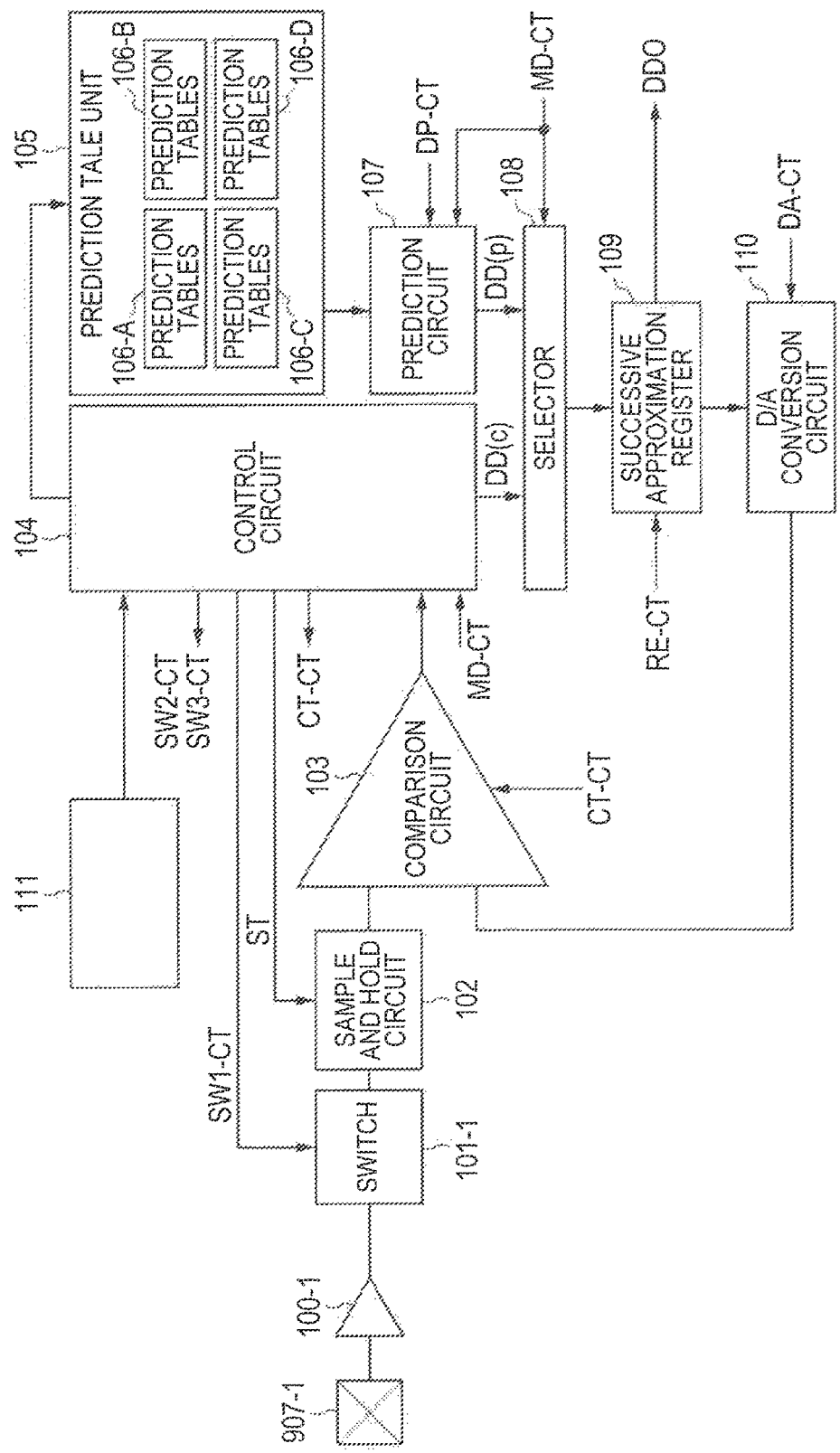
FIG. 1 is a block diagram illustrating the configuration of an A/D conversion circuit in a semiconductor device according to a first embodiment.

Hereinafter, embodiments of the present invention will be described specifically with reference to the drawings. In all of the drawings for explaining the embodiments, basically, the same reference numerals are designated to the same parts and repetitive description will not be given.

First Embodiment

Figure 9:
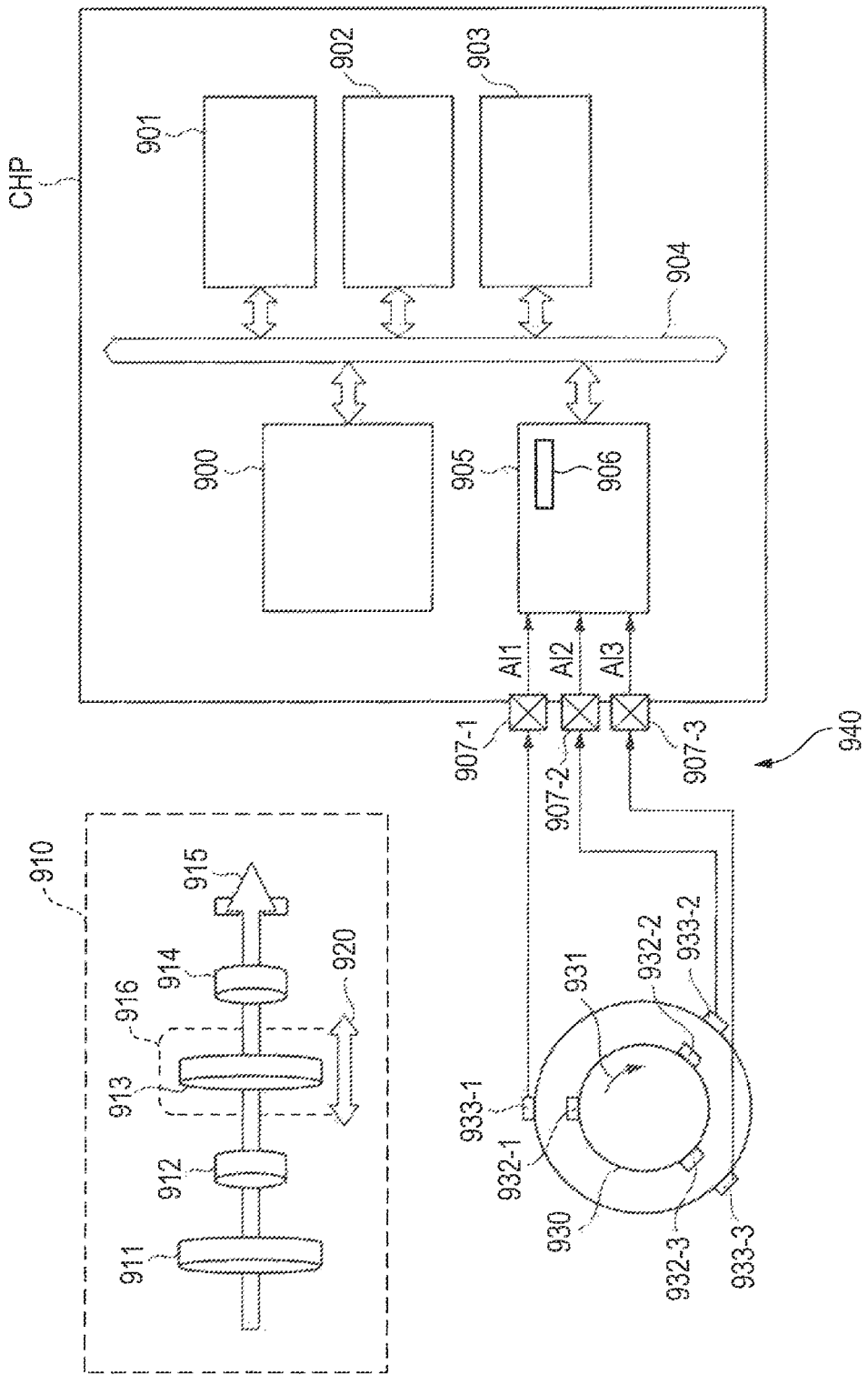
FIG. 9 is a block diagram illustrating the configuration of an electronic device using the semiconductor device according to the first embodiment.

FIG. 1 is a block diagram illustrating the configuration of an A/D conversion circuit provided in a semiconductor device CHP according to a first embodiment. Prior to description of the configuration of the A/D conversion circuit, the general configuration of the semiconductor device CHP and outline of an electronic device using the semiconductor device CHP will be described.
Configuration of Semiconductor Device CHP and Outline of Electronic Device First, using FIG. 9, the configuration of an electronic device will be described. A camera having an autofocus function will be described here as an example of the electronic device. In FIG. 9, 940 denotes a camera. In the diagram, particularly, only parts related to autofocus are schematically illustrated. In the camera having the autofocus function, a lens is moved only by a desired amount so that focus is automatically in. To move the lens only by the desired amount, in the first embodiment, a CPU (semiconductor device CHP) is used. From the viewpoint of controlling the lens, the semiconductor device CHP illustrated in FIG. 9 can be regarded as a CPU for lens control.

In FIG. 9, 910 indicates a lens mechanism to be attached to a camera. The lens mechanism 910 is provided with a plurality of lenses 911 to 914. The lenses 911 to 94 are disposed on an optical axis 915. Although not limited, the lens 913 moves in the lens mechanism 910 to make a focus on an image to be captured. In FIG. 9, the lens 913 moves to the right and left in the lateral directions as illustrated by bidirectional arrows 920. By moving the lens 913 in the lateral directions, the focus changes and the focusing can be achieved.

Although not limited, movement in the lateral directions of the lens 913 can be realized by rotating the lens 913. That is, although not illustrated, a mechanical conversion mechanism of converting the rotation of the lens 913 to the lateral movement of the lens 913 is provided. By rotating the lens 913 clockwise or anticlockwise by a motor by the mechanical conversion mechanism, the lens 913 moves to the right or left side.

To control the movement amount of the lens 913, a magnet is fixed to the frame of the lens 913, and a magnetic sensor is fixed to a cashing 916 surrounding the lens 913. The frame of the lens 913 is illustrated as 930 in the left lower side in FIG. 9 and magnets provided for the frame 930 of the lens 913 are expressed as 932-1 to 932-3. Magnetic sensors provided for the casing 916 are expressed as 933-1 to 933-3 on the left lower side in FIG. 9. 931 illustrates (clockwise) rotation of the lens.

The magnetic sensors 933-1 to 933-3 are comprised of, although not limited, hall devices, MR devices, and the like. As the lens 913 makes the rotation 931, the magnets 932-1 to 932-3 fixed to the frame 930 of the lens 913 also rotate. Consequently, the distance between the magnets 932-1 to 932-3 and the magnetic sensors 933-1 to 933-3 changes, and detection signals output from the magnetic sensors 933-1 to 933-3 also change. That is, detection signals according to the rotation amount and/or the number of rotations of the lens 913 are output from the magnetic sensors 933-1 to 933-3.

The semiconductor device CHP as the CPU for lens control receives the detection signals from the magnetic sensors 933-1 to 933-3 and controls the motor rotating the lens 913. Specifically, when the lens 913 is moved, the semiconductor device CHP rotates the motor so that the movement amount becomes the desirable one while determining the detection signals from the magnetic sensors 933-1 to 933-3.

The semiconductor device CHP has, although not limited, a central processing unit 900, a nonvolatile memory 901, a volatile memory 902, a peripheral circuit 903, an A/D conversion circuit 905, and a bus 904. The central processing unit 900, the nonvolatile memory 901, the volatile memory 902, the peripheral circuit 903, and the A/D conversion circuit 905 are mutually coupled via the bus 904. The peripheral circuit 903 denotes various circuits such as a control circuit and a timer for controlling the rotation of the motor.

According to a program stored in the nonvolatile memory 901, the central processing unit 900 executes a predetermined process by using the nonvolatile memory 902, the periphery circuit 903, and the A/D conversion circuit 905. The control of moving the lens 913 only by the desired movement amount is achieved by executing the program by the central processing unit 900.

The central processing unit 900, the nonvolatile memory 901, the volatile memory 902, the peripheral circuit 903, the A/D conversion circuit 905, and the bus 904 are formed on a single semiconductor chip by a known semiconductor manufacturing technique. The semiconductor device CHP is provided with a plurality of external terminals (pins). In FIG. 9, out of the external terminals, external terminals 907-1 to 907-3 are illustrated. The external terminals 907-1 to 907-3 are, for example, external terminals commonly used by the peripheral circuit 903 and the A/D conversion circuit 905. However, to avoid complication of the diagram, FIG. 9 illustrates the case that the external terminals 907-1 to 907-3 are used as terminals of the A/D conversion circuit 905. Obviously, the external terminals 907-1 to 907-3 may be terminals dedicated to the A/D conversion circuit 905.

The detection signal from the magnetic sensor 933-1 is supplied to the external terminal 907-1, the detection signal from the magnetic sensor 933-2 is supplied to the external terminal 907-2, and the detection signal from the magnetic sensor 933-3 is supplied to the external terminal 907-3. The detection signals output from the magnetic sensors 933-1 to 933-3 are signals of, for example, voltage values which change with time according to the distance between the magnetic sensors and the magnetic 932-1 to 932-3, respectively. That is, the detection signals are analog signals.

The detection signal supplied to the external terminal 907-1 is supplied as an analog signal AI1 to the A/D conversion circuit 905, and the detection signal supplied to the external terminal 907-2 is supplied as an analog signal AI2 to the A/D conversion circuit 905. Similarly, the detection signal supplied to the external terminal 907-3 is supplied as an analog signal AI3 to the A/D conversion circuit 905.

The A/D conversion circuit 905 has a control register 906 having a plurality of bits. According to logic values set in the bits of the control register 906, the A/D conversion circuit 905 operates. As will be described specifically later, in the first embodiment, the A/D conversion circuit 905 has two conversion modes. According to the logic value set in a predetermined bit in the control register 906, the conversion mode is designated from the two conversion modes, and the A/D conversion circuit 905 operates in the designated conversion mode. By executing the program by the central processing unit 900, a logic value is set in the predetermined bit in the control register 906 by the central processing unit 900.

In the conversion mode according to the logic value set in the predetermined bit in the control register 906, the A/D conversion circuit 905 converts each of the analog signals AI1 to AI3 to a digital signal and transmits the digital signal to the central processing unit 900 via the bus 904. The central processing unit 900 executes a process on the digital signal corresponding to the transmitted detection signal in accordance with the program to control the motor. By the operation, the lens 913 moves only by the desired movement amount so as to be in focus.

Configuration of A/D Conversion Circuit 905

FIG. 1 is a block diagram illustrating the configuration of the A/D conversion circuit 905 provided in the semiconductor device CHP according to the first embodiment. In the diagram, the control register 906 illustrated in FIG. 9 is omitted.

The A/D conversion circuit 905 according to the first embodiment is an A/D conversion circuit of a successive approximation type. Although not limited, in the embodiment, one A/D conversion circuit 905 is provided for the three external terminals 907-1 to 907-3. That is, the A/D conversion circuit 905 is commonly provided for the three external terminals 907-1 to 907-3 and is used in time-division manner for the three external terminals. Obviously, one A/D conversion circuit 905 may be provided for one external terminal.

To the A/D conversion circuit 905, although not limited, a plurality of voltages (for example, ground voltage, power supply voltage, and reference voltage) are supplied via a not-illustrated voltage line. The A/D conversion circuit 905 operates on the basis of the voltages. Those voltages are generated on the basis of the power supply voltage from a power supply terminal (pin) provided for the semiconductor device CHP. The A/D conversion circuit 905 starts operating by an interrupt signal from the central processing unit 900 or the peripheral circuit 903 or a signal from the outside of the semiconductor device CHP. At the time of operation, the A/D conversion circuit 905 operates any of the two conversion modes according to the logic value set in the predetermined bit in the control register 906 (FIG. 9). The first transform mode in the two transform modes is a normal transform mode, and the second transform mode is a predictive transform mode. The normal transform mode and the predictive transform mode will be described later. In the predictive transform mode, by using a prediction table at the time of transform (hereinbelow, also called an estimation result table), the speed of transform can be increased.

To simplify description, FIG. 9 illustrates a state where the analog signal AI1 from one external terminal 907-1 is converted to a digital signal by the A/D conversion circuit 905. Description will be given on assumption that each of the analog signals AI1 to AI3 from the magnetic sensors 933-1 to 933-3 is an analog signal whose voltage value changes with time. That is, each of the values of the analog signals AI1 to AI3 indicates a voltage value.

In FIG. 1, 100-1 denotes a buffer circuit, 101-1 denotes a switch, and 102 indicates a sample and hold circuit. The analog signal AI1 from the external terminal 907-1 is supplied to the buffer circuit 100-1, and an output of the buffer circuit 100-1 is supplied to the input of the sample and hold circuit 102 via the switch 101-1. Also between the external terminal 907-2 and the sample and hold circuit 102, a buffer circuit 100-2 (not illustrated) corresponding to the buffer circuit 100-1 and a switch 101-2 (not illustrated) corresponding to the switch 101-1 are coupled. Similarly, also between the external terminal 907-3 and the sample and hold circuit 102, a buffer circuit 100-3 (not illustrated) corresponding to the buffer circuit 100-1 and a switch 101-3 corresponding to the switch 101-1 are coupled.

The switches 101-1, 101-2, and 101-3 are controlled by switch control signals SW1-CT, SW2-CT, and SW3-CT, respectively, from a control circuit 104. At the time of converting the analog signal AI1 from the external terminal 907-1 to a digital signal, the switch 101-1 is made conductive by the switch control signal SW1-CT, and the switches 101-2 and 101-3 are made nonconductive by the switch control signals SW2-CT and SW3-CT. At the time of converting the analog signal AI2 from the external terminal 907-2 to a digital signal, the switch 101-2 is made conductive by the switch control signal SW2-CT, and the switches 101-1 and 101-3 are made nonconductive by the switch control signals SW1-CT and SW3-CT. Similarly, at the time of converting the analog signal AI3 from the external terminal 907-3 to a digital signal, the switch 101-3 is made conductive by the switch control signal SW3-CT, and the switches 101-1 and 101-2 are made nonconductive by the switch control signals SW1-CT and SW2-CT.

Consequently, any of the analog signals AI1 to AI3 is supplied to the sample and hold circuit 102 via the buffer circuit and the switch.

It can be regarded that the buffer circuits 100-1 to 100-3 and the switches 101-1 to 101-3 configure a selector selecting an analog signal. In this case, it can be regarded that the A/D conversion circuit 905 is configured by the selector and an A/D conversion circuit part. Description will be given here by regarding that the A/D conversion circuit part is also the A/D conversion circuit 905.

The A/D conversion circuit 905 (A/D conversion circuit part) has the sample and hold circuit 102, an analog comparison circuit (hereinbelow, also simply called a comparison circuit) 103, the control circuit 104, a prediction table unit 105, a prediction circuit 107, a selector (selection circuit) 108, a successive approximation register 109, a digital/analog conversion (hereinbelow, also called D/A conversion) circuit 110, and a trimming circuit 111.

The sample and hold circuit 102 fetches an analog signal supplied to the input (analog signal corresponding to the analog signal AI1 in the analog signals AI1 to AI3) and outputs it while holding it in a predetermined period (first period) and, after lapse of the predetermined period (first period), continuously outputs the voltage of the analog signal held. FIG. 4 illustrates a configuration example of the sample and hold circuit 102.

In the example illustrated in FIG. 4, the sample and hold circuit 102 has a capacitive element CS and a sampling switch SWS. The sampling switch SWS is coupled between an input "ni" and an output "no" of the sample and hold circuit 102 and is set to a conductive state (on state) or a nonconductive state (off state) by a sampling signal ST from the control circuit 104. For example, when the sampling signal ST is set to the high level, the sampling switch SWS is in the on state. When the sampling signal ST is set to the low level, the sampling switch SWS is in the off state. The capacitive element CS is coupled between the output "no" of the sample and hold circuit 102 and the ground voltage Vs.

Consequently, when the sampling signal ST is set to the high level (first period), the sample and hold circuit 102 outputs a voltage which changes according to the voltage change of the analog signal AI1 supplied to the input "ni" from the output "no", and the capacitive element CS is charged by the analog signal AI1. On the other hand, when the sampling signal ST changes to the low level, the sampling switch SWS enters the off state. Consequently, the voltage determined by the charges accumulated in the capacitive element CS is output from the output "no".

An output of the sample and hold circuit 102 is supplied to one of a pair of inputs of the comparison circuit 103. To the other input of the comparison circuit 103, an output from the D/A conversion circuit 110 is supplied. The comparison circuit 103 compares the voltage of the signal supplied to the one input with the voltage of the signal supplied to the other input and transmits the result of the comparison to the control circuit 104.

The control circuit 104 has two functions. The first function is a function of, when the normal transform mode is designated, generating a digital signal DD(c) to be stored in the successive approximation register 109 on the basis of the comparison result from the comparison circuit 103. The second function is a function of controlling the operation of the A/D conversion circuit 905.

The prediction table unit 105 has a plurality of prediction tables 106-A to 106-E generated in advance. According to a control signal from the control circuit 104, a prediction table corresponding to the analog signal supplied to the A/D conversion circuit 905 at that time is selected from the plurality of prediction tables 106-A to 106-E. The control signal from the control circuit includes the comparison result from the comparison circuit 103. FIG. illustrates the prediction tables 106-A to 106D out of the prediction tables 106-A to 106-E.

The prediction circuit 107 sequentially obtains digital signals DD(p) corresponding to the analog signals supplied to the A/D conversion circuit 905 at that time bit by bit on the basis of the prediction table selected from the prediction table unit 105 and the comparison result from the comparison circuit 103.

In the first embodiment, according to the value set in the predetermined bit in the control register 906, a mode control signal MD-CT is generated. For example, when the logic value "0" is set in the predetermined bit, the normal transform mode is designated. When the logic value "1" is set, the prediction transform mode is designated. Accordingly, when the normal transform mode is designated, the mode control signal MD-CT becomes, for example, the low level and, when the prediction transform mode is designated, the mode control signal MD-CT becomes the high level.

When the mode control signal MD-CT becomes the low level, the first function operates and the control circuit 104 generates the digital signal DD(c) to be stored in the successive approximation register 109. On the other hand, the prediction circuit 107 operates when the mode control signal MD-CT becomes the high level. By the operation of the prediction circuit 107, based on the selected prediction table and the comparison result from the comparison circuit 103, the digital signal DD(p) is generated on the bit unit basis.

To the selector 108, the digital signal DD(c) generated by the control circuit 104 and the digital signal DD(p) generated by the prediction circuit 107 are supplied. According to the mode control signal MD-CT, any one of the signals is supplied to the successive approximation register 109. In this example, when the mode control signal MD-CT is at the low level, the digital signal DD(c) generated by the control circuit 104 is supplied to the successive approximation register 109. On the other hand, when the mode control signal MD-CT is at the high level, the selector 108 supplies the digital signal DD(p) generated by the prediction circuit 107 to the successive approximation register 109.

An output of the successive approximation register 109 is supplied to the D/A conversion circuit 110 in a period during which the transform operation is executed. The D/A conversion circuit 110 converts the digital signal from the successive approximation register 109 to which the output is supplied to an analog signal corresponding to the digital signal. The converted analog signal is supplied as a reference voltage (reference value) to be compared with the analog voltage output from the sample and hold circuit 102 in the comparison circuit 103 to the other input of the comparison circuit 103.

When the converting operation is finished, the successive approximation register 109 supplies the output as a digital signal DDO corresponding to the analog signal AI1 supplied to the A/D conversion circuit 905 to the bus 904.

The trimming circuit 111 has trimming information for adjusting the characteristics of the control circuit 104 and the like and, for example, at the time of power on, supplies the trimming information to the control circuit 104. On the basis of the trimming information, the characteristics of the control circuit 104 are adjusted.

The control circuit 104 determines whether the normal transform mode or the prediction transform mode is designated on the basis of the mode control signal MD-CT and generates a comparison timing signal CT-CT for controlling the comparison circuit 103, a prediction timing signal DP- CT for controlling the prediction circuit 107, a register timing signal RE-CT for controlling the successive approximation register 109, and a D/A timing signal DA-CT controlling the D/A conversion circuit 110. Transform Modes Next, the transform modes will be described. First, an example of the control register 906 provided for the A/D conversion circuit 905 will be described. FIGS. 8A and 8B are explanatory diagrams illustrating an example of the control register 906. FIG. 8A is a bit allocation diagram illustrating a bit sequence in the control register 906. FIG. 8B is an explanatory diagram explaining the function of a predetermined bit. In the first embodiment, as illustrated in FIG. 8A, the control register 906 is configured by a register having 16 bits b0 to b15. The bit b0 is set as the predetermined bit for designating the transform mode, and EN is allocated as a symbol. The bits b1 to b15 other than the predetermined bit b0 are reserved bits and left for functionality expansion in future and the like. When the semiconductor device CHP as a CPU is reset, the logic values after reset cancellation of all of the bits b0 to b15 in the control register 906 become the logic value "0". That is, when the reset is cancelled, the predetermined bit b0 also becomes the logic value "0".

Although not limited, as illustrated in FIG. 8B, to the bit b0 in the control register 906, a "prediction enable bit" is given as the bit name. By setting the logic value "0" to the prediction enable bit, the prediction function is made invalid. By setting the logic value "1", the prediction function is made valid. When the prediction function is made invalid, the A/D conversion circuit 905 operates in the normal transform mode. When the prediction function is made valid, the A/D conversion circuit 905 operates in the prediction transform mode. In FIG. 8B, R/W indicates that writing (setting) and reading to/from the prediction enable bit b0 is can be made by the central processing unit 900.
Normal Transform Mode Next, the operation performed when the logic value "0" is set in the prediction enable bit b0 (the mode control signal MD-CT is at the low level) and the normal transform mode is designated will be described with reference to FIGS. 1, 3, and 4.

FIGS. 3A and 3B are timing charts illustrating the operations of the conversion. In the diagrams, the lateral axis indicates time. FIG. 3A illustrates the operation in the normal transform mode, and FIG. 3B illustrates the operation in the prediction transform mode.

In the normal transform mode, a sampling period STT and a subsequent comparison period CMT are regarded as a set. By one set of the sampling period STT and the comparison period CMT, an analog signal is converted to one digital signal (bit sequence). Consequently, in the case of sequentially converting analog signals to digital signals (bit sequences), the control circuit 104 generates a plurality of sets each made of the sampling period STT and the comparison period CMT.

An example of converting an analog signal to one digital signal will be described. In this case, time (cycle) of the sampling period STT is set as T (in FIG. 3, described as SST(T)).

In the sampling period STT, the control circuit 104 sets the sampling signal ST to the high level. By the operation, the sampling switch SWS (FIG. 4) enters the conductive state, the capacitive element CS is charged according to the voltage of the analog signal SI1, and the voltage at the output "no" of the sample and hold circuit 102 becomes a voltage corresponding to the analog signal AAI1 at end time of the sampling period STT.

Subsequently, the sampling signal ST is set to the low level so that the sampling switch SWS enters the nonconductive state, and the period shifts to the comparison period CMT. In the first embodiment, the case of converting the analog signal AI1 to a digital signal of a four-bit sequence is illustrated. To convert the analog signal to a digital signal of a four-bit sequence, the comparing operation is performed four times in the comparison period CMT. Consequently, the comparison period CMT is divided into first (1) to fourth (4) periods, and the successive approximation operation is performed in each of the periods. The case where the comparison period CMT and the sampling period STT are the same time T, and the first (1) to fourth (4) periods have the same time is illustrated here. Therefore, each of the first (1) to fourth (4) times (periods) is T/4 (expressed as T/4 in FIG. 3A). By setting the sampling period STT and the comparison period CMT to the same time T as described above, an analog signal can be converted to a digital signal periodically.

In the comparison period CMT, the control circuit 104 makes the D/A conversion circuit 110 generate a reference voltage having a voltage value (Vref/2) which is the half of the reference voltage Vref. It is assumed that the reference voltage Vref corresponds to the dynamic range of the A/D conversion circuit 905.

In the first period (1), the comparison circuit 103 compares the voltage value held in the sample and hold circuit 102 with the reference voltage (Vref/2) and supplies the comparison result to the control circuit 104. When the comparison result shows that the voltage value held in the sample and hold circuit 102 is a voltage higher than the reference voltage (Vref/2), the control circuit 104 outputs the digital signal DD (c) in which the most significant bit is the logic value "1". Since the selector 108 supplies the digital signal DD(c) to the successive approximation register 109 at this time, the most significant bit of the digital signal DD(c) is supplied to the most significant bit of the successive approximation register 109 via the selector 108. The control circuit 104 changes a register timing signal RE-CT at this time, so that the successive approximation register 109 sets its most significant bit to the logic value "1" of the most significant bit supplied. Since an example of converting the analog signal AI1 to a digital signal of a four-bit sequence is described here, the successive approximation register 109 is a register of four bits. It is assumed that, before the comparison period CMT, all of bits in the successive approximation register 109 are set to the logic value "0".

On the other hand, in the case where the comparison result shows that the voltage value held in the sample and hold circuit 102 indicates a voltage lower than the reference voltage (Vref/2), the control circuit 104 outputs the digital signal DD(c) in which the most significant bit is the logic value "0". When the register timing signal RE-CT changes, the successive approximation register 109 sets its most significant bit to the logic value "0" of the most significant bit supplied.

In the second period (2), depending on whether the logic value stored in the most significant bit of the successive approximation register 109 in the first period (1) is "1" or "0", the value of the reference voltage output from the D/A conversion circuit 110 changes. For example, when the most significant bit has the logic value "1", the D/A conversion circuit 110 outputs a reference voltage (3Vref/4) having a voltage value which is ¾ of the reference voltage Vref. On the other hand, when the most significant bit has the logic value "0", the D/A conversion circuit 110 outputs a reference voltage (Vref/4) having a voltage value which is ¼ of the reference voltage Vref. Also in the second period (2), the comparison circuit 103 compares the voltage value held in the sample and hold circuit 102 with the reference voltage and supplies the comparison result to the control circuit 104.

In the case where the voltage value held in the sample and hold circuit 102 indicates a voltage which is higher than the reference voltage, the control circuit 104 outputs the digital signal DD (c) in which the bit highest next to the most highest bit (the second highest bit) has the logic value "1". When the register timing signal RE-CT changes at this time, the successive approximation register 109 sets the bit next to the most significant bit (second bit) as the logic value "1" in accordance with the supplied digital signal DD (c).

On the other hand, in the case where the comparison result shows that the voltage value held in the sample and hold circuit 102 is a voltage which is lower than the reference voltage, the control circuit 104 outputs the digital signal DD(c) in which the bit highest next to the most highest bit (the second highest bit) has the logic value "0". When the register timing signal RE-CT changes at this time, the successive approximation register 109 sets the bit next to the most significant bit (second bit) as the logic value "0" in accordance with the supplied digital signal DD(c).

By setting the most significant bit and the second bit as described above, in the third period (3), the reference voltage having the voltage value of ⅛, ⅜, ⅝, or ⅞ of the reference voltage Vref is output from the D/A conversion circuit 110. According to the comparison result from the comparison circuit 103, the control circuit 104 determines the logic value of the third bit from the most significant bit and outputs it as the digital signal DD(c). The successive approximation register 109 sets the logic value of the third bit from the most significant bit in accordance with the digital signal DD(c) supplied.

Similarly, in the fourth period, the logic value of the least significant bit in the successive approximation register 109 is set.

In such a manner, the logic value is obtained every bit position from the most significant bit toward the least significant bit, and a digital signal corresponding to a voltage value held in the sample and hold circuit 102 is obtained. Although the example of determining the logic value every bit position has been described, the logic value may be determined from the least significant bit toward the most significant bit.

In the normal transform mode, in the comparison period CMT after the sampling period STT is finished, the comparison circuit 103 is operated in the cycles of ¼ of the cycle T by the comparison timing signal CT-CT to perform the successive approximation operation. Each of bits of the successive approximation register 109 is also set in the comparison period CMT. Consequently, limitation occurs in improvement in conversion speed.

Predictive Transform Mode

Next, the operation in the predictive transform mode will be described with reference to FIGS. 1, 3B, and 4. In the predictive transform mode, as illustrated in FIG. 3B, the comparison period CMT is set in parallel in time with the sampling period STT. That is, in the sampling period STT, the successive approximation operation is started.

When the predictive transform mode is designated by the mode control signal MD-CT, the control circuit 104 maintains the sampling signal ST to the high level during the sampling period STT. By the operation, the voltage of the analog signal output from the output "no" of the sample and hold circuit 102 changes according to the voltage change of the analog signal AI1 supplied to the input "ni".

The control circuit 104 regards the sampling period STT as a plurality of periods (unit sampling periods), regards also the comparison period CMT as a plurality of periods (unit comparison periods), and controls the voltage of the analog signal in each of the unit sampling periods to be sequentially compared in the unit comparison period.

Description will be given in the example illustrated in FIG. 3B. It is regarded that the sampling period STT is configured by the first period (unit sampling period) S1 to the fourth period (unit sampling period) S4. The voltage of the analog signal in the timing in the first period S1 is compared with the first reference voltage in the first period (unit comparison period) C1 and, on the basis of the comparison result, a digital signal (logic value) of the bit in the first bit (most significant bit) position is determined. The voltage of the analog signal at the timing in the second period S2 is compared with the second reference voltage in the second period C2 and, on the basis of the comparison result, a digital signal (logic value) of the bit in the second bit position is determined. Similarly, the voltage of the analog signal in the third period S3 is compared with the third reference voltage in the third period C3, and the digital signal (logic value) of the bit in the third bit position is determined. The voltage of the analog signal in the fourth period S4 is compared with the fourth reference voltage in the fourth period C4, and the digital signal (logic value) of the bit in the fourth bit (least significant bit) position is determined.

As illustrated in FIG. 4, the sample and hold circuit 102 has the capacitive element CS. In the sampling period STT, the capacitive element CS is charged by the voltage of the analog signal AI1 supplied to the input "ni". By the charging, the amount of charges accumulated in the capacitive element CS increases, so that the voltage of the analog signal output from the output "no" of the sample and hold circuit 102 rises. Consequently, in each of the unit comparison periods C1 to C4, the voltage of the analog signal at each of the timings in the unit sampling periods S1 to S4 with the first to fourth reference voltages. In other words, in each of the unit comparison periods C1 to C4, the voltage corresponding to the charge amount in the capacitive element CS at each of the timings in the unit sampling periods S1 to S4 is compared with the first to fourth reference voltages.

Consequently, the successive approximation operation can be started in the sampling period STT, and the conversion speed can be improved.

In the example illustrated in FIG. 3B, the sampling period STT has the same time (cycle) T as that of the sampling period STT in the normal transform mode. The first to fourth periods S1 to S4 configuring the sampling period STT have the same time (cycle) and each of the periods is T/4. The comparison period CMT has also the time T. The first to fourth periods C1 to C4 configuring the comparison period CMT have the same time, and each of the periods is T/4.

The voltage of the analog signal sampled in the timing in the period of S4 is compared with the reference voltage in the period C4, and a digital signal of the bit in the fourth bit (least significant bit) is determined. Consequently, after the sampling period STT is finished, when the period T/4 lapses, the bits in the first bit (most significant bit) to the fourth bit (least significant bit) are determined. That is, after the sampling period STT is finished, at a timing after lapse of one cycle, the A/D conversion is completed. The example of converting the analog signal AI1 to a digital signal of four bits has been described. That is, the A/D conversion circuit of four-bit precision has been described. The precision may be equal to or less than four bits or equal to or higher than four bits. According to a change in the precision, the number of unit sampling periods and unit comparison periods configuring the sampling period STT only changes.

In the predictive transform mode, in the sampling period STT, the comparison circuit 103 is operated. Consequently, as illustrated in FIG. 3B, the control circuit 104 performs control by a comparison timing signal CT-CT so that the comparison circuit 103 operates every cycle (1/T) from a timing after lapse of one cycle (T/4) since the sampling period STT starts. Similarly, the control circuit 104 controls the prediction circuit 107 by a prediction timing signal DP-CT so that the prediction circuit 107 operates in the periods C1 to C4. The control circuit 104 also controls the register 109 by the register timing signal RE-CT so that the successive approximation register 109 is set by the digital signal DD(p) supplied via the selector 108 in each of the periods C1 to C4. In this case, in the period C1, the bit in the first bit position in the register 109 is set by the digital signal DD(p). In the period C2, the bit in the second bit position in the register 109 is set by the digital signal DD(p). In the period C3, the bit in the third bit position in the register 109 is set by the digital signal DD(p). In the period C4, the bit in the fourth bit position in the register 109 is set by the digital signal DD(p).

Similarly, the control circuit 104 controls the D/A conversion circuit 110 by the D/A timing signal DA-CT so that the D/A conversion circuit 110 also operates in each of the periods C1 to C4.

In the predictive transform mode, first to fourth reference voltages supplied to the comparison circuit 103 are determined by reference value information stored in the prediction tables included in the reference table group. In the predictive transform mode, the bit positions (the first to fourth bit positions) of the digital signal determined by the comparison result by the comparison circuit 103 are determined by the bit position information stored in the prediction tables.

Each of the prediction tables 106-A to 106-D configuring the prediction table unit 105 is generated in advance so as to be adapted to a plurality of kinds of analog signals supplied to the A/D conversion circuit 905. For example, information necessary for prediction is extracted from electric characteristic data of the semiconductor device CHP of a maker developing and/or manufacturing the semiconductor device CHP, and the prediction tables 106-A to 106-D are generated. An example will be described. The A/D conversion circuit 905 in the semiconductor device CHP is operated in the normal transform mode. A plurality of kinds of analog signals are supplied to the A/D conversion circuit 905, digital signals corresponding to the analog signals are obtained, information necessary for prediction is extracted from the plurality of kinds of analog signals and the digital signals corresponding to the analog signals, and a prediction table corresponding to the analog signal is generated.

The prediction table unit 105 is configured by, for example, a volatile memory. In this case, for example, a plurality of prediction tables generated in advance are a part of trimming information and transferred to the prediction table unit 105 via the control circuit 104 at the time of power on. It is also possible to store a plurality of prediction tables in an external memory provided on the outside of the semiconductor device CHP and, when an electronic device 940 is activated, transfer the plurality of prediction tables from the external memory to the prediction table unit 105. Further, the prediction table unit 105 may be comprised of a nonvolatile memory. In this case, prior to shipment of the semiconductor device CHP, it is sufficient for the maker to write prediction tables in the nonvolatile memory configuring the prediction table unit 105 and ship the semiconductor device CHP.

Configuration of Prediction Table

The A/D conversion circuit 905 as an A/D conversion circuit having precision of four bits will be also described as an example. Obviously, the present invention is not limited to the precision of four bits.

Each of the prediction tables 106-A to 106-D stores reference voltage information designating the value of reference voltage (detection voltage) to be compared with the voltage of an analog signal output from the sample and hold circuit 102 and bit position information designating the position of a bit determined when the reference voltage and the voltage of the analog signal are compared at each of the timings in the unit comparison periods C1 to C4. In the first embodiment, since the voltages are compared by the comparison circuit 103, the reference voltage and reference voltage information are described. However, the present invention is not limited to the voltages. Consequently, the reference voltage may be regarded as a reference value, and the reference voltage information may be regarded as reference value information.

FIGS. 2A and 2B are diagrams each illustrating the configuration of the prediction table according to the first embodiment. FIG. 2A illustrates the configuration of a prediction table A, and FIG. 2B illustrates the configuration of a prediction table B. The prediction table A is stored as the prediction table 106-A in the prediction table unit 105, and the prediction table B is stored as the prediction table 106-B. Although prediction tables having a similar configuration are stored as the prediction tables 106-C to 106-E in the prediction table unit 105, the prediction table 106-E is not illustrated in FIG. 1.

Figure 5:
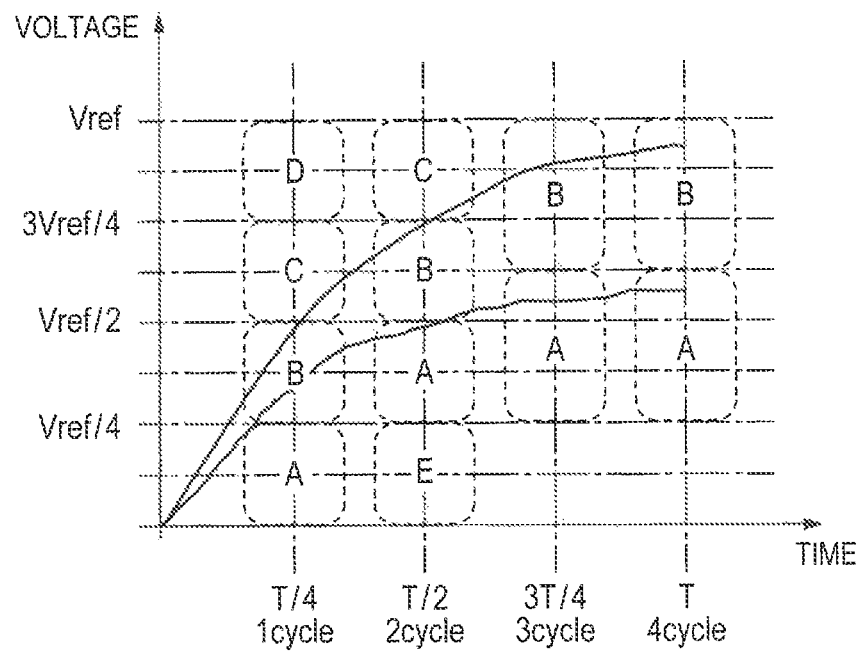
FIG. 5 is a waveform chart illustrating waveforms of analog signals output from the sample and hold circuit according to the first embodiment.

FIG. 5 is a waveform chart illustrating waveforms of analog signals AI1-A and AI1-B output from the sample and hold circuit 102. For convenience of description, the waveforms of the two analog signals are illustrated in FIG. 5. However, obviously, the two analog signals are not output at the same time. In FIG. 5, the lateral axis indicates time, and the vertical axis indicates the voltage value of the reference voltage supplied to the comparison circuit 103. As described with reference to FIG. 3B, the voltage of the analog signal in each of the unit sampling periods S1 to S4 are compared with the reference voltage in each of the unit comparison periods C1 to C4. When FIG. 3B and FIG. 5 are made correspond, the period from time 0 to time T/4, that is, the first cycle (1 cycle) corresponds to the unit sampling period S1, the period from time T/4 to time T/2, that is, the second cycle (2 cycle) corresponds to the unit sampling period S2 and the unit comparison period C1, and the period from time T/2 to time 3T/4, that is, the third cycle (3 cycle) corresponds to the unit sampling period S3 and the unit comparison period C2. Similarly, the period from time 3T/4 to time T, that is, the fourth cycle (4 cycle) corresponds to the unit sampling period S4 and the unit comparison period C3.

In the case of executing the A/D conversion successively, for the following analog signal, the time T illustrated in FIG. 5 becomes time 0, and the first to fourth cycles illustrated in FIG. 5 are repeated. In this case, the period from the time T to the time 0 corresponds to the unit comparison period C4 illustrated in FIG. 3B.

In FIG. 5, broken-line circles A to E indicate the prediction tables A to E, and the broken-line regions surrounding the reference characters A to E indicate ranges of selecting and referring to the prediction tables. For example, the preference table A is selected and referred to when the analog signal AI1-A or AI1-B enters the broken-line region surrounding the reference character A. The other prediction tables B to E are similarly selected and referred to. In the case of referring to information in the first cycle (time T/4), the information (reference voltage information and bit position information) at the time T/4 corresponding to the first cycle in the prediction table to be referred to is referred to. In the case of referring to information in the second cycle (time T/2), the information (reference voltage information and bit position information) at time T/2 corresponding to the second cycle of the prediction table to be referred to is referred to. Similarly, in the case of referring to information in the third cycle (time 3T/4), the information (reference voltage information and bit position information) at the time 3T/4 corresponding to the third cycle in the prediction table to be referred to is referred to. In the case of referring to information in the fourth cycle (time T), the information (reference voltage information and bit position information) at time T corresponding to the fourth cycle of the prediction table to be referred to is referred to.

The analog signal AI1-A will be described as an example. When time lapses from the time 0 to time T, the voltage of the analog signal AI1-A changes. In the first cycle, the analog signal AI1-A passes the broken-line region of the reference character B in the first cycle and passes the broken-line regions of the reference character A in the second to fourth cycles. The analog signal AI1-B passes the broken-line region of the reference character B in each of the first to fourth cycles.

The prediction tables C to E also have regions indicated by broken lines like the prediction tables A and B which are selected when the analog signal passes the regions. The prediction table C illustrated in FIG. 5 corresponds to the prediction table 106-C illustrated in FIG. 1, and the prediction table D corresponds to the prediction table 106-D illustrated in FIG. 1. The prediction table E corresponding to the prediction table E illustrated in FIG. 5 is not illustrated in FIG. 1. FIG. 5 illustrates the case where statically determination time is T. That is, it illustrates the case that the voltage of the analog signal output from the output "no" of the sample and hold circuit 102 is determined in the fourth cycle (T).

As described above, the prediction table stores reference value information designating the value of the reference voltage (detection voltage) and bit position information. Referring to FIGS. 2A and 2B, the prediction tables A and B will be described.

The prediction tables A and B have reference voltage information designating the reference voltage and bit position information designating the position of a bit determined at each of timings which are the time T/4, the time T/2, the time 3T/4, and the time T.

In the prediction table A, as illustrated in FIG. 2A, the reference voltage information designates the reference voltage Vref/4 and the bit position information designates the most significant bit (first bit) b3 at the timing of the time T/4. At the timing of the time T/2, the reference voltage information designates the reference voltage Vref/2, and the bit position information at that time designates b2 as the second bit position. At the timing of the time 3T/4, the reference voltage information designates the reference voltage 5Vref/8 and the bit position information at that time designates b1 as the third bit position. At the timing of the time T, the reference voltage information designates the reference voltage 3Vref/4 and the bit position information at that time designates b0 as the least significant bit (fourth bit). Vref denotes the reference voltage also in this case and corresponds to, for example, the dynamic range of the A/D conversion circuit 905.

On the other hand, in the prediction table B, as illustrated in FIG. 2B, the reference voltage information designates the reference voltage Vref/4, and the bit position information designates the most significant bit b3 at the timing of the time T/4. At the timing of the time T/2, the reference voltage information designates the reference voltage Vref/2, and the bit position information at that time designates b2 as the second bit position. At the timing of the time 3T/4, the reference voltage information designates the reference voltage 3Vref/4 and the bit position information at that time designates b1 as the third bit position. At the timing of the time T, the reference voltage information designates the reference voltage Vref and the bit position information at that time designates b0 as the least significant bit.

Operation Using Prediction Tables

Next, referring to FIGS. 1 to 5, the operation of predictive transform will be described. When the predictive transform mode is designated and the sampling switch SWS illustrated in FIG. 4 is set in the on state, the capacitive element (sampling capacitor) CS is charged by the analog signal AI1. By the charging, the amount of charges accumulated in the capacitive element CS increases, and the voltage of the analog signal output from the sample and hold circuit 102 rises. The control circuit 104 determines whether an output voltage from the sample and hold circuit 102 reaches any of the broken-line regions A to E in the first cycle (time T/4). In FIG. 5, both of the analog signals AI1-A and AI1-B reach the broken-line region B, so that the control circuit 104 selects and refers to the prediction table B corresponding to the broken-line region B. In this case, since the output voltage of the sample and hold circuit 102 reaches the broken-line region B in the first cycle, it can be predicted that the analog signal output from the sample and hold circuit 102 becomes the analog signal AI1-A or AI1-B illustrated in FIG. 5.

Referring to the prediction table B illustrated in FIG. 2B, the reference voltage information in the first cycle (time T/4) designates the reference voltage Vref/4, and the bit position information designates the most significant bit b3. Consequently, the control circuit 104 controls the D/A conversion circuit 110 so that the reference voltage Vref/4 is output from the D/A conversion circuit 110 in the unit comparison period C1 (between time T/4 to time T/2). The comparison circuit 103 compares the output voltage of the sample and hold circuit 102 with the reference voltage Vref/4. In the case where the output voltage of the sample and hold circuit 102 exceeds the reference voltage Vref/4, the most significant bit b3 is set to the logic value "1". In the case where the output voltage does not exceed, the least significant bit b3 is set to the logic value "0". That is, on the basis of the comparison result from the comparison circuit 103, the prediction circuit 107 sets the most significant bit b3 of the digital signal DD(p) to the logic value "1" or "0". In FIG. 5, since both of the analog signals AI1-A and AI1-B exceed the reference voltage Vref/4, the most significant bit b3 of the digital signal DD(p) is set to the logic value "1".

In the second cycle (time T/2), the control circuit 104 determines whether the output voltage from the sample and hold circuit 102 reaches the broken-line region B or A in time T/2. At this time, when the output voltage from the sample and hold circuit 102 reaches the broken-line region B, the control circuit 104 selects the prediction table B. On the other hand, when the output voltage reaches the broken-line region A, the control circuit 104 selects the prediction table A.

In the example of FIG. 5, the analog signal drawn on the upper side reaches the broken-line region B, so that the analog signal from the sample and hold circuit 102 is identified as the analog signal AI1-B, and the prediction table B is referred to. On the other hand, the analog signal drawn on the lower side in FIG. 5 reaches the broken-line region A, so that the analog signal from the sample and hold circuit 102 is identified as the analog signal AI1-A, and the prediction table A is referred to.

The case where the output voltage of the sample and hold circuit 102 reaches the broken-line region B will be described first. In this case, as illustrated in FIG. 2B, in the prediction table B, in the second cycle (time T/2), the reference voltage information designates the reference voltage Vref/2, and the bit position information designates the bit b2 in the second bit position. Consequently, between the time T/2 and the time 3T/4, the control circuit 104 controls so that the D/A conversion circuit 110 generates the reference voltage Vref/2. The comparison circuit 103 compares the reference voltage Vref/2 with the output voltage from the sample and hold circuit 102. When the comparison result of the comparison circuit 103 indicates that the output voltage from the sample and hold circuit 102 exceeds the reference voltage Vref/2, the prediction circuit 107 sets the bit b2 in the second bit position to the logic value "1". On the other hand, when the comparison result of the comparison circuit 103 indicates that the output voltage from the sample and hold circuit 102 does not exceed the reference voltage Vref/2, the prediction circuit 107 sets the bit b2 in the second bit position to the logic value "0".

Since the analog signal AI1-B illustrated in FIG. 5 exceeds the reference voltage Vref/2, the bit b2 in the second bit position of the digital signal DD(p) is set to the logic value "1" by the prediction circuit 107.

Next, the case where the output voltage of the sample and hold circuit 102 reaches the broken-line region A will be described. In this case, as illustrated in FIG. 2A, in the prediction table A, in the second cycle (time T/2), the reference voltage information designates the reference voltage Vref/2, and the bit position information designates the bit b2 in the second bit position. Consequently, between the time T/2 and the time 3T/4, the control circuit 104 controls so that the D/A conversion circuit 110 generates the reference voltage Vref/2. The comparison circuit 103 compares the reference voltage Vref/2 with the output voltage from the sample and hold circuit 102. When the comparison result of the comparison circuit 103 indicates that the output voltage from the sample and hold circuit 102 exceeds the reference voltage Vref/2, the prediction circuit 107 sets the bit b2 in the second bit position to the logic value "1". On the other hand, when the comparison result of the comparison circuit 103 indicates that the output voltage from the sample and hold circuit 102 does not exceed the reference voltage Vref/2, the prediction circuit 107 sets the bit b2 in the second bit position to the logic value "0".

Since the analog signal AI1-A illustrated in FIG. 5 does not exceed the reference voltage Vref/2, the bit b2 in the second bit position of the digital signal DD(p) is set to the logic value "0" by the prediction circuit 107.

Next, in the third cycle (3T/4), the control circuit 104 determines a broken-line region the output voltage from the sample and hold circuit 102 reaches in the time 3T/4. In the example of FIG. 5, in the case of the analog signal AI1-B, it is determined that the output voltage reaches the broken-line region B and the prediction table B is selected. In the analog signal AI1-A, it is determined that the output voltage reaches the broken-line region A, and the prediction table A is selected.

In the prediction table A, the reference voltage information at the time 3T/4 designates the reference voltage 5Vref/8, and the bit position information designates the bit b1 in the third bit position. In the prediction table B, the reference voltage information at the time 3T/4 designates the reference voltage 3Vref/4, and the bit position information designates the bit b1 in the third bit position.

In the case of selecting the prediction table A, the control circuit 104 controls so that the D/A conversion circuit 110 generates the reference voltage 5Vref/8 with reference to the prediction table A. In the example of FIG. 5, since the analog signal AI1-A does not exceed the reference voltage 5Vref/8, the prediction circuit 107 sets the bit b1 in the third bit position in the digital signal DD(p) to the logic value "0" on the basis of the comparison result from the comparison circuit 103. When the analog signal AI1-A exceeds the reference value 5Vref/8, the bit b1 in the digital signal DD(p) is set to the logic value "1".

In the case of selecting the prediction table B, the control circuit 104 controls so that the D/A conversion circuit 110 generates the reference voltage 3Vref/4 with reference to the prediction table B. In the example of FIG. 5, since the analog signal AI1-B exceeds the reference voltage 3Vref/4, the prediction circuit 107 sets the bit b1 in the third bit position in the digital signal DD(p) to the logic value "1" on the basis of the comparison result from the comparison circuit 103. When the analog signal AI1-B does not exceed the reference value 3Vref/4, the bit b1 in the digital signal DD(p) is set to the logic value "0".

Finally, in the fourth cycle (T), the control circuit 104 determines a broken-line region the output voltage from the sample and hold circuit 102 reaches in the time T. In the example of FIG. 5, in the case of the analog signal AI1-B, it is determined that the output voltage reaches the broken-line region B and the prediction table B is selected. In the analog signal AI1-A, it is determined that the output voltage reaches the broken-line region A, and the prediction table A is selected.

In the prediction table A, the reference voltage information at the time T designates the reference voltage 3Vref/4, and the bit position information designates the bit b0 in the least significant bit position. In the prediction table B, the reference voltage information at the time T designates the reference voltage Vref, and the bit position information designates the bit b0 in the least significant bit position.

In the case of selecting the prediction table A, the control circuit 104 controls so that the D/A conversion circuit 110 generates the reference voltage 3Vref/4 with reference to the prediction table A. In the example of FIG. 5, since the analog signal AI1-A does not exceed the reference voltage 3Vref/4, the prediction circuit 107 sets the least significant bit b0 in the digital signal DD(p) to the logic value "0" on the basis of the comparison result from the comparison circuit 103. When the analog signal AI1-A exceeds the reference value 3Vref/4, the least significant bit b0 in the digital signal DD(p) is set to the logic value "1".

In the case of selecting the prediction table B, the control circuit 104 controls so that the D/A conversion circuit 110 generates the reference voltage Vref with reference to the prediction table B. In the example of FIG. 5, since the analog signal AI1-B does not exceed the reference voltage Vref, the prediction circuit 107 sets the least significant bit b0 in the digital signal DD(p) to the logic value "0" on the basis of the comparison result from the comparison circuit 103. When the analog signal AI1-B exceeds the reference value Vref at this time, the least significant bit b0 in the digital signal DD(p) is set to the logic value "1".

By executing the A/D conversion using the prediction tables as described above, the reference voltage and the output voltage from the sample and hold circuit can be successively compared in the sampling period STT. That is, in the sampling period STT, the successive comparing operation can be executed, and higher speed can be achieved.

In the predictive transform mode, the digital signal DD(p) is sequentially set in the successive approximation register 109 via the selector 108. That is, in the period between the time T/4 and the time T/2, the most significant bit b3 of the digital signal DD(p) is transferred to the most significant bit b3 of the successive approximation register 109. In the period between the time T/2 and the time 3T/4, the bit b2 in the second bit position of the digital signal DD(p) is transferred to the second bit b2 of the successive approximation register 109. In the period between the time 3T/4 and the time T, the bit b1 in the third bit position of the digital signal DD(p) is transferred to the third bit b1 of the successive approximation register 109. In the period between the time T and the time 0 in the following transform, the least significant bit b0 of the digital signal DD(p) is transferred to the least significant bit b0 of the successive approximation register 109.

Finally, when the digital signal corresponding to the analog signal AI1-A is regarded as a bit sequence (b3, b2, b1, b0) from the most significant bit b3 toward the least significant bit b0, the logic values become "1, 0, 0, 0". Similarly, the logic values of the digital signal corresponding to the analog signal AI1-B become "1, 1, 1, 0".

Whether the output voltage of the sample and hold circuit 102 reaches any of the broken-line regions A to E in each of the times T/4, T/2, 3T/4, and T can be determined by detecting the output voltage from the comparison circuit 103 by the control circuit 104. In the first embodiment, since the comparison circuit 103 is an analog comparison circuit, by the output voltage from the comparison circuit 103, the control circuit 104 can detect the output voltage of the sample and hold circuit 102. In each of the unit sampling periods S1 to S4, for example, from the voltage difference between the output voltage of the sample and hold circuit 102 at the time of starting sampling and the output voltage of the sample and hold circuit 102 at the time of finishing the sampling, the gradient of the output voltage of the sample and hold circuit 102 is detected and, according to the gradient, the prediction table may be selected.

The analog signal AI1-B illustrated in FIG. 5 uses only the prediction table B in the predictive transform mode. Consequently, in other words, the prediction table B can be regarded as a prediction table corresponding to the analog signal AI1-B. In this case, it can be regarded that the prediction table B has the reference voltage information designating the reference voltage to be compared with the corresponding analog signal AI1-B in each of the timings T/4, T/2, 3T/4, and T and the bit position information designating the position of the bit determined by the comparison.

Improvement in Noise Resistance

In the semiconductor device CHP according to the first embodiment, noise resistance can be improved. Next, an example of the case where the output voltage of the sample and hold circuit 102 changes due to noise will be explained, and it will be described that improvement in noise resistance can be achieved.

Figure 6:
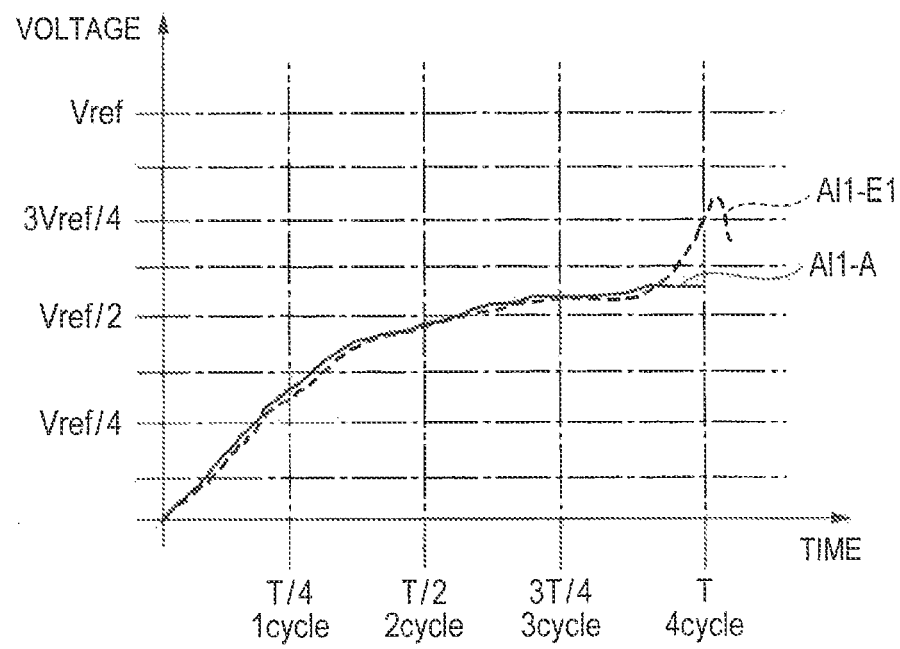
FIG. 6 is a waveform chart illustrating waveforms of analog signals output from the sample and hold circuit according to the first embodiment.

FIG. 6 is a waveform chart illustrating waveforms of analog signals output from the sample and hold circuit 102. The lateral axis in the diagram indicates time, and the vertical axis indicates the voltage. The analog signal AI1-A expressed by the solid line in FIG. 6 is the same as the analog signal AI1-A expressed in FIG. 5. In FIG. 6, an analog signal AI1-E1 expresses the waveform in the case where the charge amount of the sample and hold circuit 102 sharply increases due to noise occurred just before statically determination. That is, the case that noise is transmitted to the capacitive element CS in the sample and hold circuit 102 just before the sampling switch SWS (FIG. 4) enters the off state and the charge amount of the capacitive element CS increases is illustrated. When the charge amount increases, the output voltage (voltage of the analog signal) of the sample and hold circuit 102 rises.

In the case of A/D converting the output voltage (analog signal AI1-E1) whose voltage value is changed by the noise in, for example, the normal transform mode, as illustrated in FIG. 3A, the voltage corresponding to the amount of charges accumulated in the capacitive element CS in the sampling period STT is converted to the digital signal. Consequently, the output voltage whose voltage value is increased by the noise as the voltage to be converted to a digital signal is subjected to successive approximation in the comparing period CMT and A/D converted.

On the other hand, in the predictive transform mode, as illustrated in FIG. 3B, the successive approximation starts in the sampling period STT. Bits obtained by the successive approximation are sequentially stored in the successive approximation register 109. In the first embodiment, by the successive approximation executed in the comparison period CMT, the digital signals of the bits are determined from the most significant bit b3 toward the least significant bit b0.

Figure 7A:
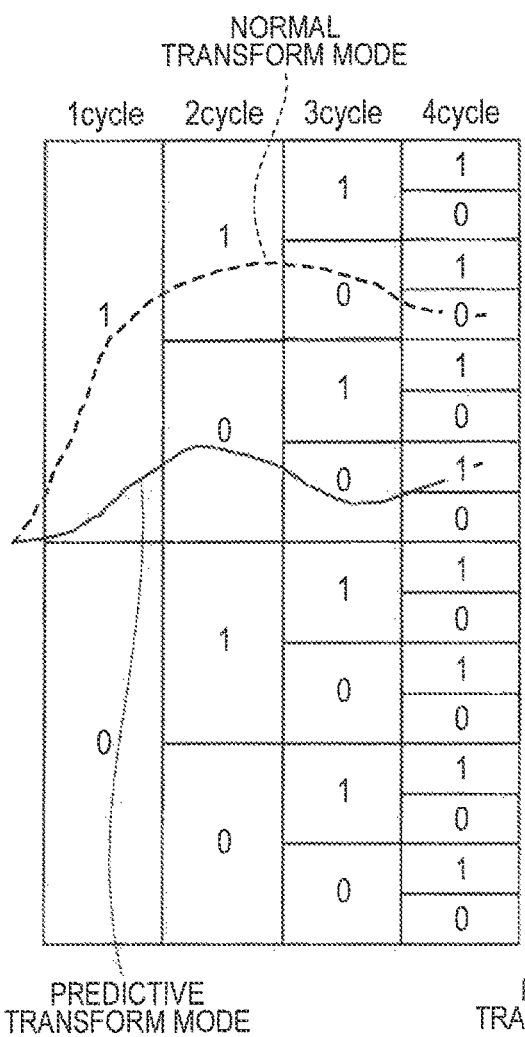
FIGS. 7A and 7B are explanatory diagrams for describing the operation of the A/D conversion circuit according to the first embodiment.
Figure 7B:
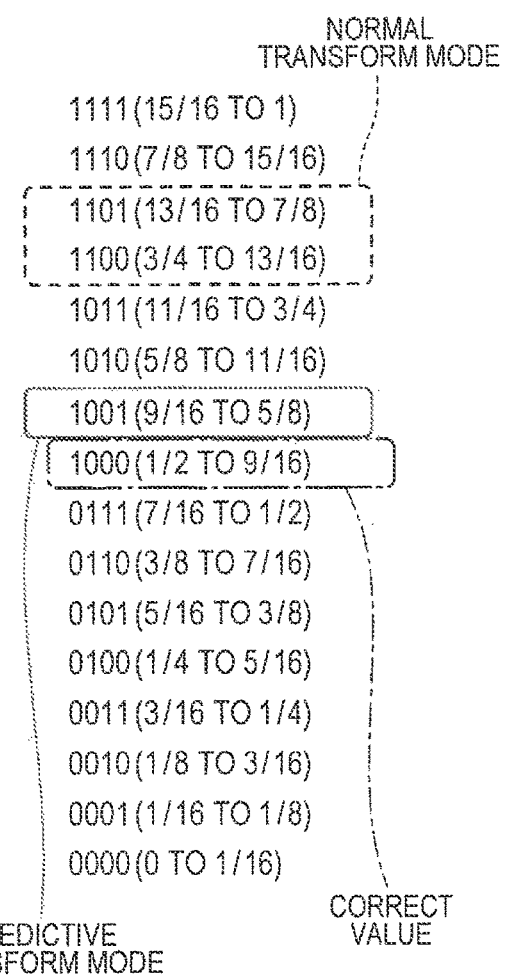

FIGS. 7A and 7B are explanatory diagrams for describing the case of A/D converting the output voltage (analog signal AI1-E1) in the normal transform mode and the case of A/D converting the output voltage in the predictive transform mode. FIG. 7A illustrates transform steps in the normal transform mode and transform steps in the predictive transform mode, and FIG. 7B illustrates digital signals obtained by the transforms.

In FIG. 7A, the broken line expresses the flow of the transform steps in the normal transform mode, and the solid line expresses the flow of the transform steps in the predictive transform mode. In FIG. 7A, each of the first to four cycles indicates the unit comparison period in the comparison period CMT. By successive approximation in each of the unit comparison periods, a digital signal of a bit is determined from the most significant bit toward the least significant bit. It is to be noted that the first to fourth cycles in the normal transform mode are the unit comparison periods in the comparison period CMT after the sampling period STT as illustrated in FIG. 3A whereas the first to fourth cycles in the predictive transform mode are unit comparison periods in the comparison period CMT parallel to the sampling period STT as illustrated in FIG. 3B.

In the normal transform mode, the A/D converting operation is performed using the voltage value which is statically determined in the sampling period STT as a voltage to be converted. Consequently, the voltage value of the output voltage as the object of the A/D conversion becomes the voltage value at the time T (the voltage between the reference voltage 3Vref/4 and the reference voltage 7Vref/8) as illustrated in FIG. 6. In the normal transform mode, the voltage value at the time T is transformed by, for example, transform steps to be described as follows.

In the first cycle (1cycle), the voltage value as the object of A/D conversion and the reference voltage Vref/2 are compared. In the second cycle (2cycle), according to the comparison result in the first cycle, the reference voltage 3Vref/4 or Vref/4 and the voltage value as the object of the A/D conversion are compared. Hereinafter, in the third cycle (3cycle), the reference voltage selected according to the comparison result in the second cycle and the voltage value as the object of the A/D conversion are compared. In the fourth cycle (4cycle), the reference voltage selected according to the comparison result in the third cycle and the voltage value as the object of the A/D conversion are compared. According to the comparison results in the cycles, the digital signals (logic values) of the bits are determined from the most significant bit b3 toward the least significant bit b0. It is assumed here that when the voltage value as the object of the A/D conversion exceeds the reference voltage to be compared, the digital value of the bit is set to the logic value "1" and, when the voltage value does not exceed the reference voltage, the logic value "0" is set.

In the example of FIG. 6, the voltage value as the object of the A/D conversion is a voltage between the reference voltage 3Vref/4 and the reference voltage 7Vref/8. Consequently, the most significant bit b3 is set to the logic value "1" in the first cycle. The second bit b2 is also set to the logic value "1" in the second cycle. In the third cycle, the third bit b1 is set to the logic value "0". In the fourth cycle, the least significant bit is set to the logic value "1" or "0". Consequently, as surrounded by the broken line in FIG. 7B, in the normal transform mode, digital signals obtained by the A/D conversion become "1, 1, 0, 1" or "1, 1, 0, 0".

On the other hand, in the predictive transform mode, the output voltages of the sample and hold circuit 102 in the unit sampling periods S1 to S4 illustrated in FIG. 3B are sequentially compared with the reference voltage in the unit comparison periods C1 to C4, and digital signals (logic values) of bits are set from the most significant bit b3 toward the least significant bit b0. In the predictive transform mode, the operations in the case of A/D converting the analog signal AI1-E1 are the same as the operations in the case of converting the analog signal AI1-A described with reference to FIGS. 2 and 5 except for the period from the time T to the time 0. In the case of the analog signal AI1-E1, its voltage value exceeds 3Vref/4 at the time T due to noise. Consequently, in the predictive transform mode, the least significant bit b0 is set to the logic value "1". As a result, when the analog signal AI1-E1 is converted in the predictive transform mode, the digital signals obtained become "1, 0, 0, 1".

When the output voltage of the sample and hold circuit 102 does not change due to noise, the analog signal AI1-A is output from the sample and hold circuit 102. In this case, the analog signal AI1-A is converted to the digital signals "1, 0, 0, 0" as described with reference to FIGS. 2 and 5. That is, the correct digital signals are "1, 0, 0, 0".

In the case of performing the A/D conversion in the normal transform mode, the digital values obtained by the conversion are values apart from the correct digital signals. Particularly, in the case of increasing weighting from the least significant bit b0 toward the most significant bit b3, a largely different result is obtained.

On the other hand, in the predictive transform mode, in the sampling period STT, comparison is performed cycle by cycle to determine the digital signal of a bit. Consequently, only the least significant bit set in the fourth cycle changes due to the influence of noise but the rest of the bits, that is, from the most significant bit to the third bit are not subjected to the influence of noise. Therefore, in the predictive transform mode, a digital signal close to a correct digital signal can be obtained. That is, the influence of noise can be made small and noise resistance can be improved.

In FIG. 7B, numbers in parentheses attached to the logic values of the digital signal express the range of voltages corresponding to the digital signal by the reference voltage. For example, the numbers 15/16 to 1 in the parentheses attached to the logic values "1111" of the digital signal express that the voltage expressed by the logic values of the digital signal lies in the range from the reference voltage 15Vref/16 to the reference voltage Vref. The other numbers in the parentheses express similarly.

For example, when Vref is set to 3V, the correct digital signal "1000" expresses 1.5V to 1.7V. On the other hand, the range of the digital signals "1100" and "1101" obtained in the case of converting the analog signal AI1-E1 whose voltage value is changed by noise in the normal transform mode is about 2.25V to about 2.6V. On the other hand, the range of the digital signal "1001" obtained in the case of converting the analog signal AI1-E in the predictive transform mode is about 1.7V to about 1.9V. As described above, the influence of noise can be reduced.

Second Embodiment

Figure 10:
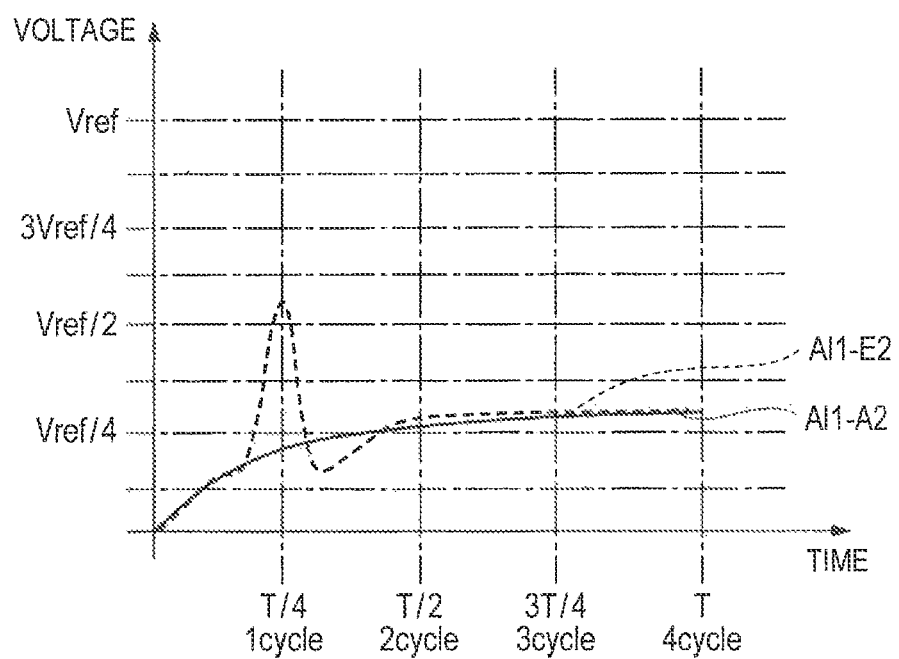
FIG. 10 is a waveform chart illustrating waveforms of analog signals output from a sample and hold circuit.

In the semiconductor device CHP according to the first embodiment, by designating the predictive transform mode, even when the output voltage of the sample and hold circuit 102 is changed by noise just before static determination as the final stage of the sampling period STT, the influence by noise can be reduced. However, the output voltage of the sample and hold circuit 102 changes, not only just before static determination but also at various timings due to noise. FIG. 10 illustrates an example of the case where the output voltage of the sample and hold circuit 102 is changed by noise at the initial stage of the sampling period STT.

FIG. 10 illustrates waveforms of analog signals output from the sample and hold circuit 102. The lateral axis of the diagram indicates time, and the vertical axis of the diagram indicates voltage. In FIG. 10, an analog signal whose voltage value is not changed by noise is expressed by the solid line like in FIG. 6 as an analog signal AI1-A2. An analog signal whose voltage value is changed by noise is expressed by the broken line like in FIG. 6 as an analog signal AI1-E2. In the case of FIG. 10, at the initial stage of the sampling period STT, the output voltage of the sample and hold circuit 102 is changed by noise. In the example, referring to FIG. 3B, the case that noise occurs around the time T/4 (the first cycle: 1 cycle) and the charge amount in the capacitive element CS (FIG. 4) sharply increases due to the occurred noise and, after that, sharply decreases is illustrated.

FIGS. 11A and 11B are explanatory diagrams for explaining the case of A/D converting the analog signal AI1-A2 as the output voltage of the sample and hold circuit 102 in, for example, the predictive transform mode and the case of A/D converting the analog signal AI1-E2 in the predictive transform mode. FIG. 11A illustrates, like FIG. 7A, transform steps in the predictive transform mode. The curve drawn by the solid line expresses the transform steps in the case of converting the analog signal AI1-A2, and the curve drawn by the broken line expresses the transform steps in the case of converting the analog signal AI1-E2. FIG. 11B illustrates, like FIG. 7B, digital signals obtained by the transforms.

In the predictive transform mode, first prediction is performed in the first cycle (1cycle). Specifically, referring to the prediction table, the reference voltage is determined on the basis of the reference voltage information, and the position of a bit to be set is determined on the basis of the bit position information. Since the analog signal AI1-A2 does not reach the reference voltage Vref/4 at the time T/4, it reaches the broken-line region A illustrated in FIG. 5. That is, the control circuit 104 (FIG. 1) selects the prediction table A. Consequently, the reference voltage Vref/4 designated by the reference voltage information in the time T/4 in the prediction table A is supplied to the comparison circuit 103. In the case of the analog signal AI1-A2, the voltage value at the time T/4 does not exceed the reference voltage Vref/4, so that the logic value "0" is set in the most significant bit b3 designated by the bit position information.

On the other hand, in the case of the analog signal AI1-E2, the voltage value at the time T/4 exceeds the reference voltage Vref/2. Specifically, the voltage value reaches the broken-line region C illustrated in FIG. 5. Consequently, referring to the prediction table C, the control circuit 104 determines a reference voltage to be supplied to the comparison circuit 103 from the reference voltage information in the time T/4 in the prediction table C, and determines the bit designated by the bit position information on the basis of a comparison result from the comparing circuit 103. In this case, the reference voltage information of the prediction table C designates, for example, Vref/2. The bit position information designates the most significant bit b3. As a result, when the analog signal AI1-E2 is transformed in the predictive transform mode, the logic value "1" is set in the most significant bit b3.

In any of the analog signals AI1-A2 and AI1-E2, in the second cycle, the prediction table E is referred to and the second bit b2 is set. In the third and fourth cycles, the prediction table A is referred to and the third bit b1 and the least significant bit b0 are set.

Consequently, in the analog signal AI1-A2, as illustrated in the solid line in FIG. 11A, the logic values of the bits are sequentially set from the most significant bit b3 toward the least significant bit b0 and, as illustrated in FIG. 11B, the analog signal AI1-A2 is converted to a digital signal (correct value) whose logic values are "0, 1, 0, 0". Also in the analog signal AI1-E2, as illustrated in the broken line in FIG. 11A, the logic values of the bits are sequentially set from the most significant bit b3 toward the least significant bit b0. As a result, the analog signal AI1-E2 whose voltage is changed by noise at the initial stage of the sampling period STT is converted to a digital signal expressed by the broken line illustrated in FIG. 11B. That is, it is converted to a digital signal whose logic values are "1, 0, 0, 0" in which the most significant bit b3 is set to the logic value "1".

When the output voltage of the sample and hold circuit 102 is changed by noise at the initial stage of the sampling period STT, the logic value of the most significant bit b3 becomes erroneous, and it is feared that the value is largely far from prediction. In the case where the weighting of the most significant bit is the highest, when prediction of the most significant bit fails, even if the failure is tried to be recovered in the second to fourth cycles, it becomes difficult to precisely obtain a digital signal more than the digital signal whose most significant bit is the logic value "1". That is, it is difficult to predict the digital values of the logic values "1, 0, 0, 0" more precisely.

In the second embodiment, the semiconductor device CHP having the A/D conversion circuit capable of suppressing deterioration in precision even when the output voltage of the sample and hold circuit 102 changes undesirably at the initial stage of the sampling period STT is provided. In other words, the semiconductor device CHP in which noise resistance is improved is provided.

Since the configuration of the semiconductor device CHP according to the second embodiment is similar to that of the semiconductor device CHP described in the first embodiment, the different points will be mainly described here.

Figure 12:
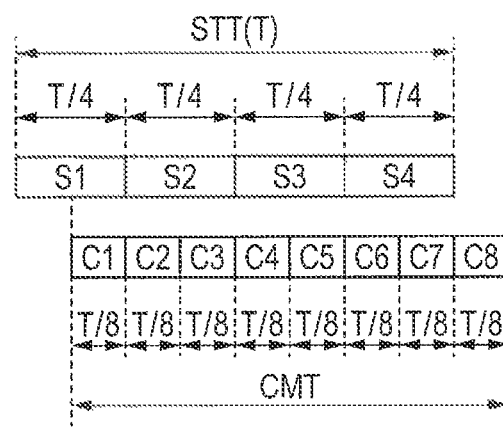
FIG. 12 is a timing chart illustrating the operation of the A/D conversion circuit according to the second embodiment.

In the second embodiment, when the predictive transform mode is designated, the operation frequency of the successive approximation executed in the comparison period CMT is set to the value twice as high as that in the first embodiment. FIG. 12 is a timing chart illustrating the converting operation in the semiconductor device CHP according to the second embodiment. FIG. 12 illustrates timings of converting an output signal (analog signal) from the sample and hold circuit 102 to a digital signal having a bit sequence of four bits like in FIG. 3B. Consequently, at the time of obtaining a plurality of digital signals, the timings illustrated in FIG. 12 are repeated.

In FIG. 12, the operations in the sampling period STT are the same as those in FIG. 3B. Specifically, in the sampling period STT, the sampling switch SWS (FIG. 4) is set in the on state. On the other hand, in the comparison period CMT, the operation of successive approximation is executed at a frequency which is higher by twice. That is, in the first embodiment, the comparison period CMT is configured by the four unit comparison periods C1 to C4. In the second embodiment, the comparison period CMT having the same time (T) as that in the first embodiment is configured by eight unit comparison periods C1 to C8. In this case, the time of each of the unit comparison periods is T/8. Since the successive approximation operation is performed in each of the unit comparison periods C1 to C8, the frequency of the successive approximation operation becomes twice as high as that in the first embodiment.

On the other hand, the sampling period STT is comprised of four unit sampling periods S1 to S4 like in the first embodiment. In the first embodiment, two unit comparison periods are assigned to one unit sampling period. To be specific, unit comparison periods C1 and C2 are assigned to the unit sampling period S1, unit comparison periods C3 and C4 are assigned to the unit sampling period S2, and unit comparison periods C5 and C6 are assigned to the unit sampling period S3. Unit comparison periods C7 and C8 are assigned to the unit sampling period S4. In this case, two unit comparison periods (for example, C1 and C2) assigned to a common unit sampling period (for example, S1) are close to each other in time.

In each of the two unit comparison periods assigned to the same unit sampling period, a prediction table is selected on the basis of voltage values at different timings in the unit sampling period. In the case of selecting the same prediction table, referring to the selected prediction table, as described in the first embodiment, the output voltage from the sample and hold circuit 102 and the reference voltage are compared by using the reference voltage information and the bit position information, and the logic value of the designated bit is set. That is, in a manner similar to the first embodiment, the operation of the successive approximation is executed in the unit comparison period.

On the other hand, in the case of selecting different prediction tables, by referring to any one of the prediction tables, as described in the first embodiment, the output voltage from the sample and hold circuit 102 and the reference voltage are compared by using the reference voltage information and the bit position information, and the logic value of the designated bit is set. That is, in a manner similar to the first embodiment, the operation of the successive approximation is executed in the unit comparison periods.

When the prediction table to be selected on the basis of the voltage signals at timings different from each other in the same unit sampling period are the same, the voltage of the analog signal output from the sample and hold circuit 102 does not change largely in the unit sampling period. Consequently, on assumption that the analog signal is not changed by noise, the converting operation is executed with reference to the prediction tables. On the other hand, when prediction tables selected are different, it is determined that the voltage of the analog signal output from the sample and hold circuit 102 in the unit sampling period largely changes, and the analog signal is changed by noise. In this case, for example, from a change in the output voltage from the sample and hold circuit 102 at a timing of selecting a prediction table, a proper prediction table is referred to and the converting operation is executed. Consequently, deterioration of the precision can be suppressed even when the output voltage from the sample and hold circuit 102 is changed by noise at the initial stage of the sampling period STT. That is, noise resistance can be improved.

It can be also regarded that one of two unit comparison periods assigned to one unit sampling period can be regarded as a redundant unit comparison period. That is, it can be also regarded that the frequency of successive approximation is set to twice as high as that in the first embodiment, and redundancy comparison is performed.

Figure 13:
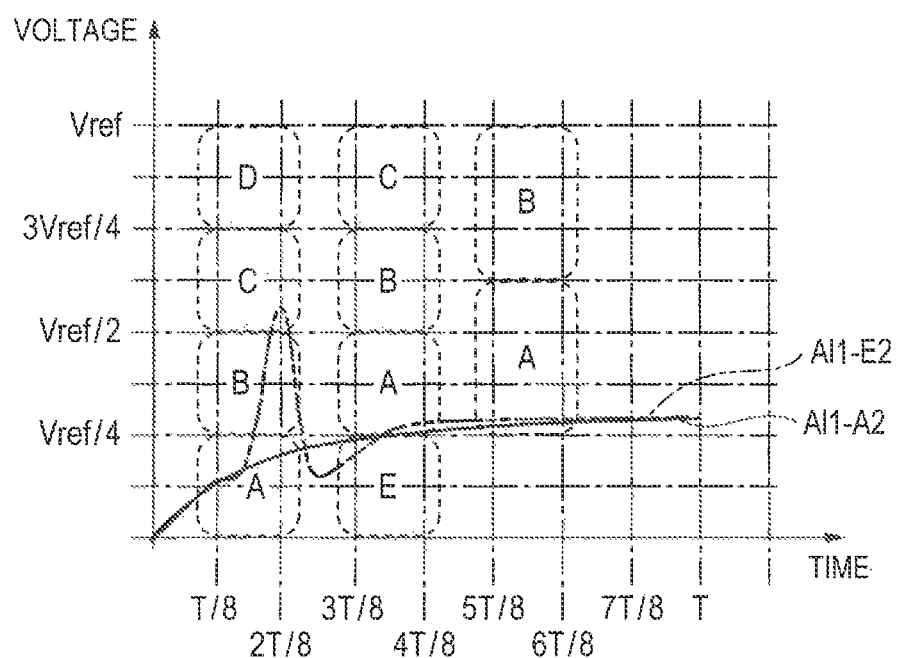
FIG. 13 is a waveform chart illustrating waveforms of analog signals output from a sample and hold circuit according to the second embodiment.

FIG. 13 is a waveform chart illustrating waveforms of the analog signals AI1-A2 and AI1-E1 output from the sample and hold circuit 102. In the diagram, the lateral axis indicates time, and the vertical axis denotes voltage. The analog signal AI1-A2 illustrated in FIG. 13 is the same as the analog signal AI1-A2 illustrated in an alternate long and two short dashes line is the same as the analog signal AI1-E2 illustrated in FIG. 10. In FIG. 13, like in FIG. 5, the ranges of the prediction tables A to E are indicated as broken-line regions. FIG. 13 illustrates, to avoid complication of the drawing, only a broken-line region of the prediction table referred to in the unit comparison periods C1 and C2, a broken line region of the prediction table referred to in the unit comparison periods C3 and C4, and a broken-line region of the prediction table referred to in the unit comparison periods C5 and C6. That is, the broken-line region of the prediction table referred to in the unit comparison periods C7 and C8 is not illustrated in FIG. 13.

As described with reference to FIG. 10, if the charge amount of the capacitive element CS in the sample and hold circuit 102 does not change due to noise or the like, the analog signal AI1-A2 is output from the sample and hold circuit 102. In contrast, when the charge amount of the capacitive element CS in the sample and hold circuit 102 is changed by noise around the time T/4, the analog signal output from the sample and hold circuit 102 changes like the analog signal AI1-E2.

The control circuit 104 in the second embodiment selects a prediction table from the prediction table unit 105 on the basis of the voltage value of the analog signal output from the sample and hold circuit 102 in each of the unit comparison periods C1 to C8. In FIG. 13, in the unit comparison periods C1 (time T8), C2 (2T/8), C3 (3T/8), C4 (4T/8), C5 (5T/8), C6 (6T/8), C7 (7T/8), and C8(T), the control circuit 104 determines an analog signal from the sample and hold circuit 102 and selects a prediction table referred to.

When the analog signal AI1-E2 is determined in the unit comparison period C1 (time T/8), the analog signal AI1-E2 reaches the broken-line region of the prediction table A, so that the prediction table A is selected. In the unit comparison period C2 (time 2T/8), the analog signal AI1-E2 reaches the broken-lie region of the prediction table C, so that the prediction table C is selected.

When the prediction table A selected for the first time and the prediction table C selected in the second time are different in the same unit sampling period S1, the control circuit 104 determines that the voltage of the analog signal AI1-E2 from the sample and hold circuit 102 largely changes. When the broken-line region of the prediction table selected in the second time is higher than that of the prediction table selected in the first time, the control circuit 104 determines that the voltage of the analog signal AI1-E2 is changed by noise around the determination of the second time and executes the converting operation with reference to the prediction table selected for the first time. In contrast, when the broken-line region of the prediction table selected in the second time is lower than that of the prediction table selected in the first time, the control circuit 104 determines that the voltage of the analog signal AI1-E2 is changed by noise around the determination of the first time, and executes the converting operation with reference to the prediction table selected in the second time.

When the prediction table selected in the first time and that selected in the second time are the same, the control circuit 104 executes the converting operation with reference to, for example, the prediction table selected in the first time.

By adding the cycle of redundant comparison, the prediction result can be corrected, and the noise resistance can be improved.

In the second embodiment, the circuit of comparing the prediction table selected in the first time and the prediction table selected in the second time, comparing the broken-line regions in the prediction tables, and determining the prediction table referred to is added to the control circuit 104.

Modification

In a modification, with reference to the prediction table selected in the first time, reference voltage based on the reference voltage information stored in the prediction table is generated by the D/A conversion circuit 110. The generated reference voltage and the output voltage of the sample and hold circuit 102 are compared by the comparison circuit 103 in the unit comparison period C1 (first timing). On the basis of the comparison result, the digital signal (logic value) of the bit designated by the bit position information stored in the prediction table selected in the first time is determined by the prediction circuit 107. Subsequently, referring to the prediction table selected in the second time, the reference voltage based on the reference voltage information stored in the prediction table is generated by the D/A conversion circuit 110. The generated reference voltage and the output voltage of the sample and hold circuit 102 are compared by the comparison circuit 103 in the unit comparison period C2 (second timing). On the basis of the comparison result, the digital signal (logic value) of the bit designated by the bit position information stored in the prediction table selected in the second time is determined by the prediction circuit 107.

The digital signal of the first time and the digital signal of the second time determined by the prediction circuit 107 are supplied to the control circuit 104, and are compared in the control circuit 104. For example, when the bit positions are the same and the digital signals (logic value) are the same as a result of the comparison, it is determined that the output voltage from the sample and hold circuit 102 is not changed, and any of the digital signals is supplied to the successive approximation register 109 via the selector 108.

When the digital signal of the first time and the digital signal of the second time are different as a result of the comparison, for example, when the bit positions are the same and the digital signals (logic values) are different or the bit positions are different, the control circuit 104 determines whether the digital signal of the second time expresses a value increased or decreased from the digital value of the first time including the bit positions. When the digital signal of the second time increases from the digital signal of the first time, the control circuit 104 supplies the digital signal of the first time to the successive approximation register 109 via the selector 108. On the other hand, when the digital signal of the second time decreases from the digital signal of the first time, the control circuit 104 supplies the digital signal of the second time to the successive approximation register 109 via the selector 108.

In other words, based on the comparison result in the unit comparison period C1 (first timing) and the comparison result in the unit comparison period C2 (second timing), the digital signal of the bit position designated by the bit position information is determined and stored in the successive approximation register 109.

In the modification, although not illustrated in FIG. 1, a signal line transmitting the digital signal of the first time and the digital signal of the second time from the prediction circuit 108 to the control circuit 104 is provided. In the modification, the digital signal of the first or second time is supplied to the successive approximation register 109 and used as a part of the A/D converted digital signal, and the digital signal of the first or second time which is not supplied to the successive approximation register 109 is discarded.

Third Embodiment

Figure 14:
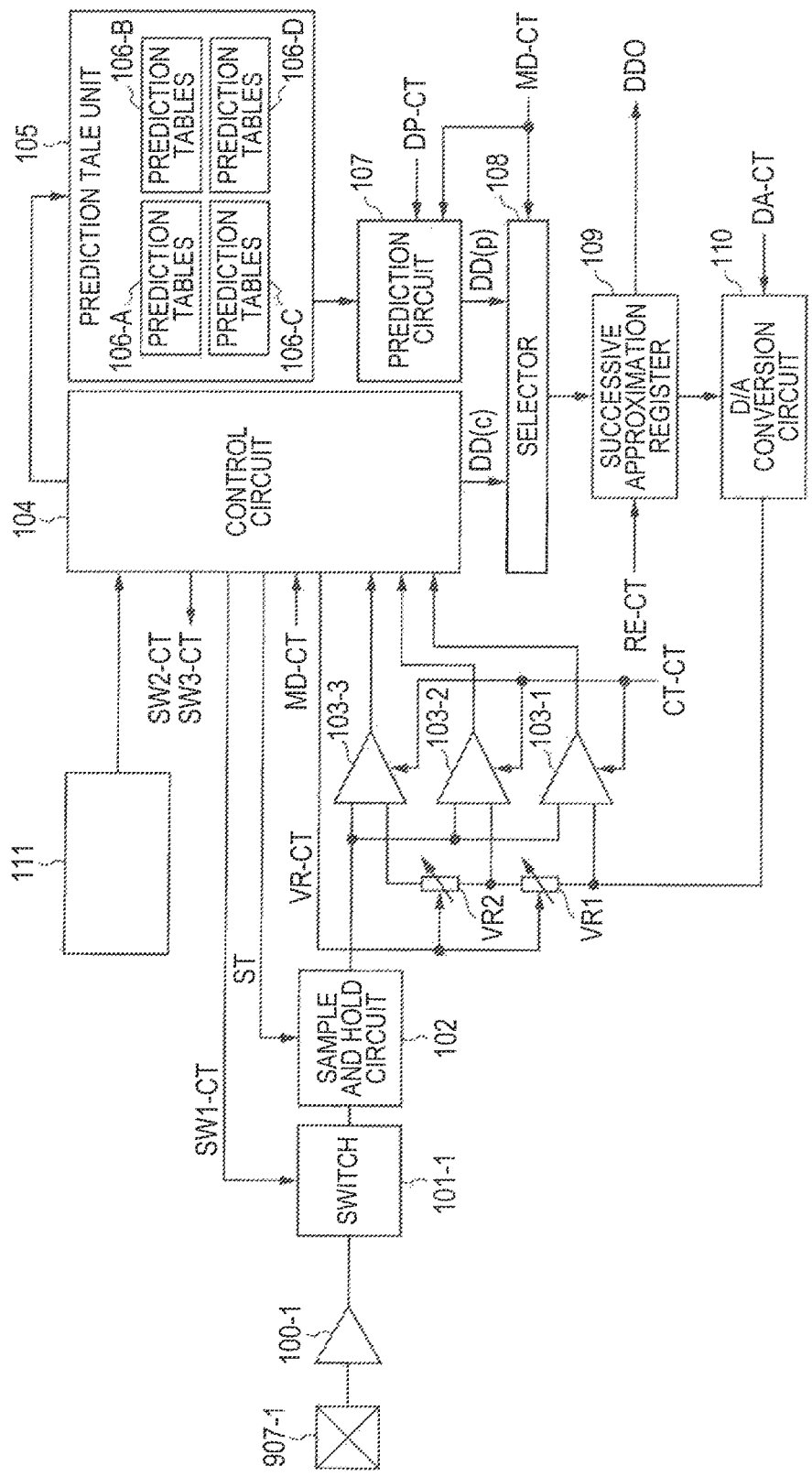
FIG. 14 is a block diagram illustrating the configuration of an A/D conversion circuit in a semiconductor device according to the third embodiment.

FIG. 14 is a block diagram illustrating the configuration of the A/D conversion circuit 905 in the semiconductor device CHP according to the third embodiment. Since FIG. 14 is similar to FIG. 1, the different points will be mainly described here.

In the first embodiment, one comparison circuit 103 is provided for the A/D conversion circuit 905. In contrast, in the third embodiment, the comparison circuit 103 is configured by three comparison circuits 103-1 to 103-3. To one of inputs of each of the comparison circuits 103-1 to 103-3, the voltage of the analog signal is supplied from the output "no" of the sample and hold circuit 102. In the third embodiment, reference voltage is supplied from the D/A conversion circuit 110 to the other input of the comparison circuit 103-1, and reference voltage is supplied from the D/A conversion circuit 110 via a variable voltage circuit VR1 to the other input of the comparison circuit 103-2. To the other input of the comparison circuit 103-3, reference voltage is supplied from the D/A conversion circuit 110 via variable voltage circuits VR1 and VR2.

The variable voltage circuits VR1 and VR2 change the voltage values of the reference voltages supplied to the other inputs of the comparison circuits 103-2 and 103-3 according to the variable voltage control signal VR-CT from the control circuit 104. Each of the variable voltage circuits VR1 and VR2 is configured by, for example, a variable resistive element.

The comparison circuit 103-1 operates so as to compare the reference voltage from the D/A conversion circuit 110 and the voltage from the sample and hold circuit 102. In contrast, the comparison circuit 103-2 compares the voltage from the sample and hold circuit 102 and a voltage obtained by subtracting a voltage drop amount in the variable resistive element (variable voltage circuit VR1) from the reference voltage from the D/A conversion circuit 110 as a reference voltage. The comparison circuit 103-3 compares the voltage from the sample and hold circuit 102 and a voltage obtained by subtracting a voltage drop amount in the variable resistive element (variable voltage circuits VR1 and VR2) from the reference voltage from the D/A conversion circuit 110 as a reference voltage. By the operation, in one cycle (one successive approximation) digital signals (logic values) of two bits can be determined. In this case, the bit position information stored in the prediction table designates the bit position of two bits (plural bits). In each of the designated two bits, the digital signal (logic value) is set according to the comparison results of the comparison circuits 103-1 to 103-3. As a result, the speed of the A/D conversion can be increased.

In the second embodiment, redundant comparison is performed. Specifically, one of the comparisons of twice is redundant comparison. By combining the second and third embodiments, even when redundant comparison is performed, the digital signal (logic value) of two bits can be made in one cycle, and speed of the A/D conversion can be increased while improving noise resistance.

Although the example of performing the comparison in the same unit comparison period by using three comparison circuits has been described, the invention is not limited to three comparison circuits, but larger number of comparison circuits may be used. In this case, the bit position information stored in the prediction table designates bits of larger number of bit positions. Obviously, the bit positions designated are positions different from one another.

Although the present invention achieved by the inventors herein has been concretely described on the basis of the embodiments, obviously, the present invention is not limited to the embodiments but can be variously changed without departing from the gist.

For example, it is also possible to measure the voltage of an analog signal supplied to the input "ni" of the sample and hold circuit 102 for short time, obtain a voltage change in the short time, and select a prediction table in the prediction table unit 105 from the obtained voltage change.

One of inputs of the comparison circuit 103 (103-1 to 103-3) may be provided with a differentiation circuit. Since a detection signal corresponding to a gradient of a change in the output voltage is output from the differentiation circuit by a change in the output voltage of the sample and hold circuit 102, a prediction table may be selected from the prediction table unit 105 by the detection signal.

A plurality of sets each made of the sample and hold circuit 102 and the comparison circuit 103 may be provided. In this case, the plurality of sets may be sequentially operated, for example, at intervals.

In FIG. 9, a camera is illustrated as an example of the electronic device 940, and autofocus has been described. However, the invention is not limited to the above. In the case of similarly using a camera as the electronic device 940, the invention is not limited to autofocus but can be also applied to hand-shake correction. In the case of hand-shake correction, a change in the vertical and/or lateral directions of a lens is output as an analog signal from, for example, a hall sensor. The invention can be applied also to the case of A/D converting the analog signal from the hall sensor.

Further, the electronic device 940 is not limited to a camera and the invention can be applied to A/D conversion of various electronic devices such as a paper feeder of a printer, a thermometer, a barometer, a hygrometer, and a human body sensor.

What is claimed is:

1. A semiconductor device having an analog/digital conversion circuit converting an analog signal to a digital signal, comprising:
   a holding circuit outputting an analog signal having a value according to a value of an analog signal supplied in a first period;
   a comparison circuit comparing the analog signal with a reference value at each of a plurality of timings included in the first period; and
   a prediction circuit generating a first digital signal based on a comparison of the comparison circuit and bit position information from a prediction table corresponding to the supplied analog signal.

2. The semiconductor device of claim 1, further comprising:
   a prediction table unit storing the prediction table, the prediction table comprising:
      reference value information designating a reference value to be compared with the analog signal output from the holding circuit at a plurality of timings in the first period; and
      the bit position information,
   wherein the bit position information designates a bit position of a digital signal determined by comparison with the reference value.

3. The semiconductor device of claim 1, wherein the prediction table comprises a plurality of prediction tables each having reference value information determining a reference value compared in the comparison circuit at each of the plurality of timings and bit position information designating a bit position of a digital signal determined by comparison by the comparison circuit.

4. The semiconductor device of claim 3, wherein the prediction circuit determines a digital signal of a bit position designated by bit position information in a prediction table selected from the plurality of prediction tables on the basis of comparison by the comparison circuit, the prediction circuit generating the first digital signal by determining a digital signal of a bit position designated by the bit position information at each of the plurality of timings.

5. The semiconductor device of claim 1, further comprising:
   a control circuit generating a second digital signal based on a comparison of the comparison circuit.

6. The semiconductor device of claim 5, further comprising:
   a selection circuit which selects the first or second digital signal.

7. The semiconductor device of claim 1, further comprising:
   a control circuit generating a prediction timing signal, the prediction circuit generating the first digital signal under control of the prediction timing signal.

8. The semiconductor device of claim 7, further comprising:
   a comparison circuit comparing the analog signal output from the holding circuit with a reference voltage,
   wherein the control circuit compares an analog signal held in the holding circuit with a reference value by the comparison circuit in the first period, thereby generating a digital signal corresponding to the analog signal held in the holding circuit.

9. The semiconductor device of claim 7, wherein the control circuit generates a sampling signal for controlling the holding circuit.

10. A method of converting an analog signal to a digital signal, comprising:
    outputting an analog signal having a value according to a value of an analog signal supplied in a first period;
    comparing the analog signal with a reference voltage at each of a plurality of timings included in the first period; and
    generating a first digital signal based on a comparison of the comparison circuit and bit position information from a prediction table corresponding to the supplied analog signal.

11. The method of claim 10, further comprising:
    storing the prediction table, the prediction table comprising:
       reference value information designating a reference value to be compared with the analog signal at a plurality of timings in the first period; and
       the bit position information,
    wherein the bit position information designates a bit position of a digital signal determined by comparison with the reference value.

12. The method of claim 11, wherein the prediction table comprises a plurality of prediction tables each having reference value information determining a reference value compared at each of the plurality of timings, and bit position information designating a bit position of a digital signal determined by the comparing of the analog signal.

13. The method of claim 12, further comprising:
    determining a digital signal of a bit position designated by bit position information in a prediction table selected from the plurality of prediction tables on the basis of the comparing of the analog signal; and
    generating the first digital signal by determining a digital signal of a bit position designated by the bit position information at each of the plurality of timings.

14. The method of claim 11, further comprising:
    generating a second digital signal based on the comparing of the analog signal.

15. The method of claim 14, further comprising:
    selecting the first or second digital signal.

16. A semiconductor device having an analog/digital conversion circuit converting an analog signal to a digital signal, comprising:
    a holding circuit outputting an analog signal;
    a comparison circuit comparing the analog signal with a reference value;
    a control circuit which generates a control signal including a comparison of the comparison circuit;
    a prediction table unit which selects a prediction table based on the control signal; and
    a prediction circuit generating a digital signal based on the selected prediction table.

* * * * *